(12) United States Patent
Schaadt

(10) Patent No.: US 7,655,553 B2
(45) Date of Patent: Feb. 2, 2010

(54) MICROSTRUCTURE SEALING TOOL AND METHODS OF USING THE SAME

(75) Inventor: Gregory P. Schaadt, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 457 days.

(21) Appl. No.: 11/622,179

(22) Filed: Jan. 11, 2007

(65) Prior Publication Data

US 2007/0172991 A1 Jul. 26, 2007

Related U.S. Application Data

(60) Provisional application No. 60/758,111, filed on Jan. 11, 2006.

(51) Int. Cl.
*H01L 21/00* (2006.01)
*H01L 21/44* (2006.01)
*B23K 31/00* (2006.01)

(52) U.S. Cl. .................... 438/615; 438/26; 438/28; 438/613; 228/180.22; 257/E21.509; 257/E33.056

(58) Field of Classification Search .................. 438/26, 438/28, 613, 615; 228/180.22; 257/E21.509, 257/E33.056
See application file for complete search history.

(56) References Cited

U.S. PATENT DOCUMENTS

| 7,282,432 | B2 * | 10/2007 | Tago et al. ............... 438/613 |
| 7,341,880 | B2 * | 3/2008 | Erchak et al. ............ 438/26 |
| 7,348,193 | B2 * | 3/2008 | Ouyang ................... 438/25 |
| 7,528,061 | B2 * | 5/2009 | Syllaios et al. ........... 438/612 |
| 2005/0079644 | A1 * | 4/2005 | Sakurada .................. 438/26 |
| 2005/0274969 | A1 * | 12/2005 | Suzuki .................... 257/98 |

* cited by examiner

*Primary Examiner*—David A Zarneke
(74) *Attorney, Agent, or Firm*—Charles A. Brill; Wade James Brady, III; Frederick J. Telecky, Jr.

(57) ABSTRACT

A method of packing electronic devices and an apparatus thereof are disclosed herein. The method allows for usage of solder materials with a melting temperature of 180° C. or higher, such as from 210° C. to 300° C., and from 230° C. to 260° C., so as to provide reliable and robust packaging. This method is particularly useful for packaging electronic devices that are sensitive to temperatures, such as microstructures, which can be microelectromechanical devices (MEMS), such as micromirror array devices.

5 Claims, 14 Drawing Sheets

MICROSTRUCTURE SEALING TOOL AND METHODS OF USING THE SAME

CROSS REFERENCE

This U.S. patent application claims priority under 35 U.S.C. 119(e) from provisional U.S. patent application Ser. No. 60/758,111 to Gregory Schaadt filed Jan. 11, 2006, the subject matter being incorporated herein by reference in its entirety.

TECHNICAL FIELD

The technical field of the examples to be disclosed in the following sections is generally related to the art of packaging methods for electronic devices (e.g. any device that receives or transmits electronic signals) including, but not limited to, microelectromechanical devices, semiconductor devices, light emitting devices, light modulating devices, or light detecting devices, and more particularly, to packaging methods for such devices particularly those that are temperature sensitive during packaging.

BACKGROUND

Microstructures, such as microelectromechanical devices, have many applications in basic signal transduction. For example, a spatial light modulator based on a microelectromechanical device (MEMS) modulates light beams in response to electrical or optical signals. Such a modulator can be a part of a communication device or an information display. For example, micromirrors are key components of MEMS-based spatial light modulators. A typical MEMS-based spatial light modulator usually consists of an array of miniature reflective deflectable micromirrors. These micromirrors can be selectively deflected in response to electrostatic forces so as to reflect incident light by individual micromirrors for producing digital images. Such micromirrors, however, are sensitive to temperature and contamination, such as moisture and dust. This contamination has varying effects on the micromirrors, from capillary-condensation and post-release stiction to deterioration of the micromirror surfaces, which may result in mechanical failure of the micromirror devices in operation. For this and other reasons, micromirror devices are often packaged after releasing.

Regardless of differences of the packaging methods currently developed for a micromirror array device, two substrates, one for supporting the device and another one for covering the device, and sealing medium(s) for bonding the two substrates are utilized. Most of the sealing mediums require application of heat during bonding and sealing. The heat, however, may degrade the micromirror array device if not properly applied, especially for those microstructures and semiconductor devices that are temperature sensitive. For example, improperly applied heat may change the desired mechanical properties of the microstructures. It may also thermally activate particles, such as impurities and particles making up the functional components of the microstructures, prompting diffusion of these activated particles within the microstructures, thus exacerbating degradation of the microstructures. Or heat may decrease anti-stiction materials within the package.

Therefore, a method and an apparatus are needed for packaging microstructure, semiconductor, light emitting device, light modulating device, or light detecting device, particularly those that are temperature sensitive during packaging.

SUMMARY

In one example, an embedded heater in the package substrate is used to produce localized heat for melting the solder material, which may have a melting temperature of 180° C. or higher, such as from 210° to 300° C. degrees. For avoiding crack or deformation of the package lid, an external heater is used to maintain the package lid at a uniform temperature higher than the melting temperature of the solder material. As an aspect of the example, a temperature gradient is produced in a direction perpendicular to the surface of the package lid. As another aspect of the example, a heat exchanger, preferably at a temperature lower than the temperature of the external heater or the embedded heater is attached to the package substrate. With the heat exchanger, a temperature gradient can be produced from the package lid to the heat exchanger, with which, heat produced in the package during the packaging process can be ducted to the heat exchanger and released outside the package. By controlling temperature of the heat exchanger, the temperature of the electrical device in the package can be controlled, especially maintained at a tolerable temperature range.

As another aspect of the example, the embedded heater is driven by a current profile, an example of which comprises a current ramp-up stage, a current maintaining stage, and a current ramp-down stage. This profile is particularly useful for avoiding potential damages to the package elements due to abrupt temperature change.

DETAILED DESCRIPTION OF EXAMPLES

Figure 1:
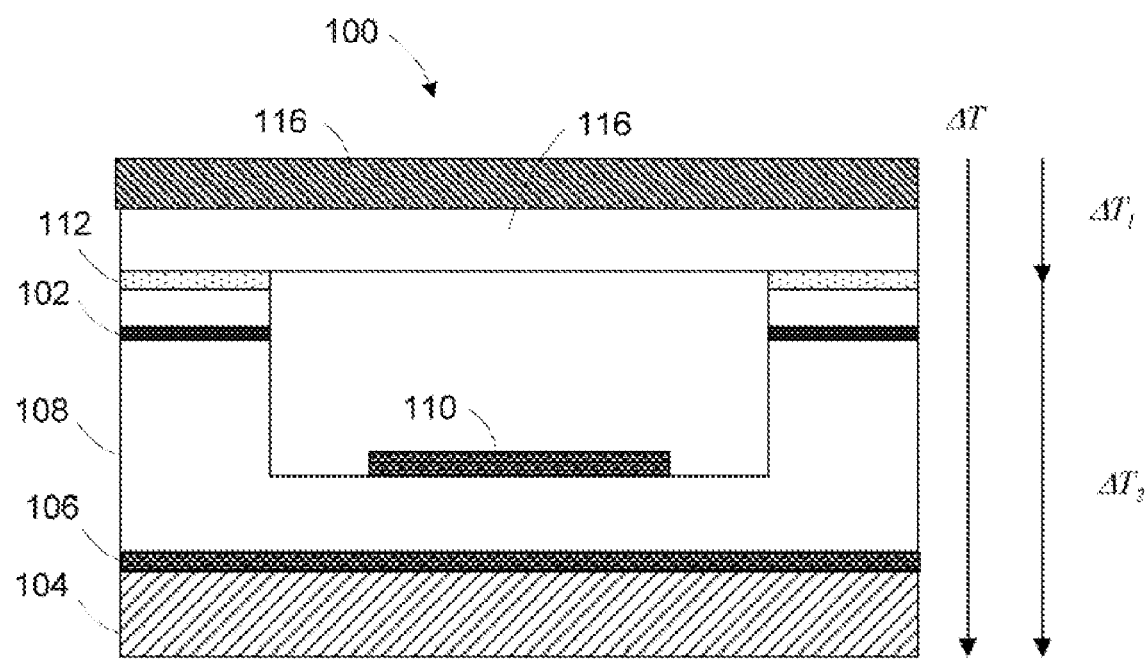
FIG. 1 is a cross-section of an exemplary package showing an exemplary packaging process.

Disclosed herein comprises a method of packing electronic devices and an apparatus thereof. The method allows for usage of solder materials with a melting temperature of 180° C. or higher, such as from 210° C. to 300° C., and from 230° C. to 260° C., so as to provide reliable and robust packaging. This method is particularly useful for packaging electronic devices that are sensitive to temperatures, such as microstructures, which can be microelectromechanical devices (MEMS), such as micromirror array devices. In the following, the method and apparatus will be discussed with reference t selected examples. However, it will be understood that the following discussion is for demonstration purposes, and should not be interpreted as a limitation. Instead, any variations within the scope are applicable.

Turning to the drawings, FIG. 1illustrates a cross-section view of an electronic device in a package during a packaging process. Electronic device 110 is disposed on a supporting surface of a cavity in package substrate 108. The electronic device, in general, has a tolerant temperature, exceeding which the electronic device can be damaged or failed. As a way of example wherein the electronic device is a micromirror array device, the tolerant temperature can be 200° C. or less, 180° C. or less, 160° C. or less, 150° C. or less, and 140° C. or less. Therefore, the temperatures in the vicinity of the electronic device during packaging processes and operations are desired to be equal to or less than the tolerant temperature.

Integral heater 102 is embedded under the surface of the package substrate, as set forth in U.S. patent application Ser. No. 10/443,318 filed May 22, 2003, the subject matter being incorporated herein by reference. Other packages, such as that set forth in U.S. patent application Ser. No. 10/852,981 filed May 24, 2004, the subject matter being incorporated herein by reference, are also applicable.

The package substrate in this particular example has a cavity in which the electronic device is disposed. Alternatively, the package substrate can be a flat substrate provided with a spacer so as to form a space between the package lid and package substrate for accommodating the electronic device. The package substrate can be a ceramic comprising multiple ceramic layers, such as alumina or other suitable materials, such as plastic. In general, it is preferred that the package substrate is made of a material that is electrically insulting but with satisfactory thermal properties. For example, it is desired that the material of the package substrate preferably has a thermal conductivity of 5 W/m.K or higher, such as 10 W/m.K or higher, 16.7 W/m.K or higher, and more preferably from 10 K/m.K to 35 W/m.K. As an alternative feature, a dedicated heat duct, such as a metallic thread can be implemented in the package. The thermal duct thread can be disposed in the package substrate and connecting the integral heater at one end and the bottom of the package substrate at the other end, which is not shown in the drawing. The material of the package substrate is also desired to posse a high temperature tolerance, such as a temperature of 300° C. or higher, more preferably 350° C. or higher, such that during the packaging process, the package substrate does not deform or crack. In additional to the thermal properties, the material for the package substrate is also desired to be mechanically reliable and strong. For example, the material for the package substrate preferably has a strength of 100 GPa or higher, 350 GPa or higher, and 400 GPa or higher, and more preferably from 300 GPa to 500 GPa.

For avoiding potential damages to electrical device 110 due to heating and handling during the packaging process, a substrate insert, such as a silicon substrate insert can be disposed between the bottom substrate of electronic device 110 and the supporting surface of the package substrate, as set forth in U.S. patent applications Ser. No. 10/698,656 filed Oct. 30, 2003, and Ser. No. 11/100,104 filed Apr. 5, 2005, the subject matter of each being incorporated herein by reference in entirety.

For enclosing the electronic device, package lid 114, such as a light transmissive plate (e.g. glass, quartz, or sapphire) is placed on top of the package substrate to be hermetically (or non-hermetically) bonded to the package substrate with sealing medium 112. The sealing medium is preferably a material that is stable, reliable, cost-effective and has good thermal-properties (e.g. co-efficient of thermal expansion (CTE), thermal-conductivity etc.) compatible with the other components, such as the package substrate and/or package lid 114. The sealing material can be an inorganic material, such as a metal, a metal alloy, a metal compound (e.g. a metal or metalloid oxide) or a glass frit.

It is preferred that the sealing medium has a melting temperature of 160° C. or higher, or 180° C. degrees or higher, or even 200° C. or higher, more preferably from 180° C. to 240° C., more preferably from 180° C. to 210° C. for reliable seal quality. Exemplary sealing mediums comprise glass frit, such as Kyocera KC-700, $BiIn_x$, $Au_xSn_y$, Au, $BiSn_x$, $InAg_x$, $PbSn_x$, and copper. It is preferred that the sealing medium comprises tin or lead. In one example, the sealing medium comprises $Au_xSn_y$ wherein the ratio of x:y is from 10:90 to 80:20. The melting temperature of $Ag_xSn_y$ is 180° C. or higher, such as from 180° C. to 230° C., from 180° C. to 282° C., and from 180° C. to 210° C.

Most solderable metallic materials, such as those discussed above, however, have poor adhesion to oxide materials that often compose the surfaces of the substrates (e.g. the package substrate and the package lid). To solve this problem, a metallization layer can be provided to the bonding surface of the package lid and/or the bonding surface of the package substrate before applying the solderable metallic sealing mediums. The metallization layer can be composed of a material with a high soldering temperature, such as 180° C. degrees or higher. Exemplary metallization materials are aluminum, gold, nickel, or a composition thereof, such as $AuNi_x$. These materials can be deposited on the surfaces as thick or thin films using suitable deposition methods, such as sputtering printing or pasting.

As an example, a metallization film comprising a tungsten layer, a nickel layer, and a gold layer is deposited on the bonding surface of the package substrate with the tungsten layer at the bottom of the stack. Another metallization film comprising a chromium layer, a nickel layer, and a gold layer is deposited on the bonding surface of the package lid with the chromium layer contacting the bonding surface of the package lid. The $Au_xSn_y$ solder layer is disposed between the two metallization layers.

During the packaging process, the region in the vicinity of the electronic device is preferably lower then its tolerant temperature, such as 180° C. or lower, more preferably 160° C. or lower, 140° C. or lower, and 120° C. or lower, but higher than 0° C., and more preferably higher than 10° C., depending upon the specific device. Package lid is maintained at a temperature preferably higher than the melting temperature of the solder material, such as 180° C. or higher, 210° C. or higher, and 230° C. or higher. However, too much heat on the package lid may crack or deform the package lid. Moreover, too much heat to or too long heating of the package lid may cause dissolving of the metallization material (e.g. gold) into the solder material (e.g. $Au_xSn_y$). Such dissolving will detach the solder material from the package lid, resulting in poor or unsuccessful bonding process. Too much heat may also result in gains and/or vacant of the solder material after bonding—which in turn degrades the bonding quality. For this reason, the package lid is preferably maintained at a temperature of from 180° C. to 350° C., more preferably from 200° C. to 250° C., and more preferably from 210° C. to 240° C., and more preferably around 230° C. The heat from external heater 116 can be applied to the entire package lid so as to uniform the temperature and heat across the entire package lid. In this way, cracking and deformation of the package lid due to the heat can be prevented. The external heat can be in any suitable forms, an example of which will be discussed with reference to FIG. 3 afterwards. During the packaging process, external heat is preferably contacted against to the package lid to secure uniform heating of the entire package lid. Pressure can alternatively be applied to the package lid for reinforcing the contact between the package lid to the package substrate.

With embedded heater 102 and external heater 116, a temperature gradient $\Delta T$ can be established from external heat 116 to the bottom of package substrate 108. Such temperature gradient comprises the first gradient $\Delta T_1$ from the contacting surface between external heater 116 and the top surface of package lid 114 to solder medium 112; and the second gradient $\Delta T_2$ from the solder medium to the bottom of the package substrate. In an example, gradient $\Delta T_1$ is preferably minimized, but preferably not zero, so as to uniformly melting the solder material of the solder medium without causing any damages to the package or the electrical devices due to heating and temperature (or temperature distribution). $\Delta T_2$, however, is preferably large so as to duct the localized heat in the boding region (i.e. the region in the vicinity of the embedded heater and solder material) to the package bottom. For effectively dissipating the heat from the package bottom, and also the heat in the area wherein the electronic device is disposed, heat exchanger 104 is provided, and can be attached to the bottom of the package substrate, as shown in the figure. In one example, the heat exchanger is preferably maintained at a temperature of 50° C. or lower, more preferably 40° C. or lower, but preferably higher than 0° C. degree, or 10° C. degrees so as to avoid any potential damages, such as deformation and crack of the package substrate and/or the substrate of the electronic device. Maintaining the heat exchanger at the desired temperature can be accomplished in many ways, one of which is through water-cooling, which will be discussed with reference to FIG. 4 afterwards.

In order to improve the heat dissipation from the package substrate to the heat exchange during the packaging process, thermal pad 106 is disposed between the bottom of the package substrate and heat exchanger. The thermal pad is preferably plastic such that it can be closely attached to the bottom of the package substrate and the contacting surface of the heat exchanger. The heat pad preferably has a high thermal conductivity, such as 200 W/m.k or higher, 237 W/m.k or higher, and 300 W/m.k or higher. More preferably, the thermal pad has a thermal conductivity between the thermal conductivities of the package substrate and heat exchanger so as to form smooth heat dissipation channels from the bottom of the package substrate to the heat exchanger.

In an exemplary boding process, the heat exchanger is maintained at a temperature from 5° C. to 50° C., more preferably around 40° C., and external heater 116 at a temperature of 210° C. or higher, such as 210° C. to 240° C., more preferably around 230° C. The embedded heat can be operated with an electrical current profile so as to prevent potential damages to the package components or degradations of the packaging quality, which will be discussed in the following with reference to FIG. 2.

Figure 2:
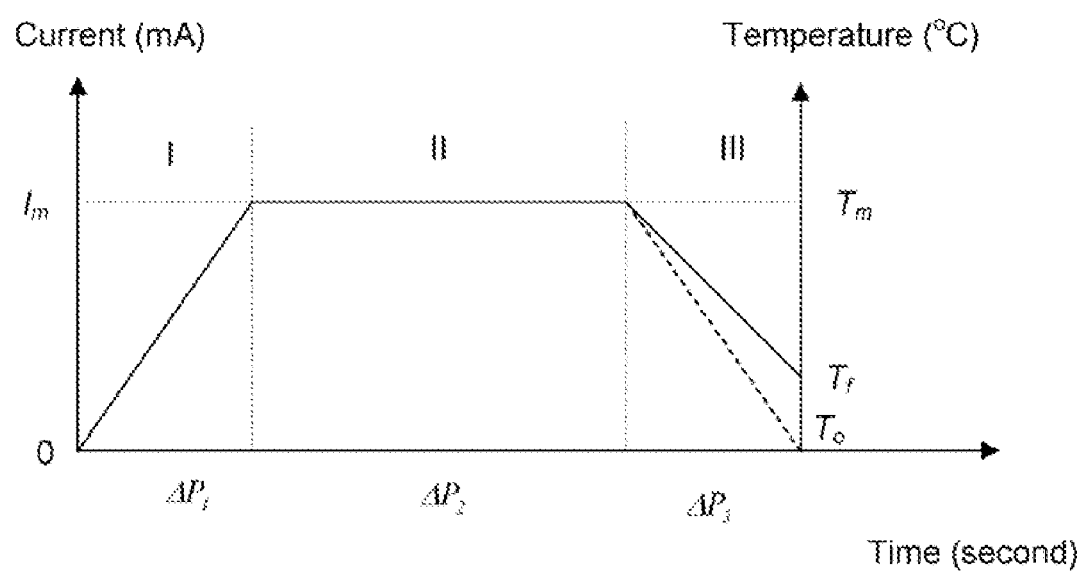
FIG. 2 schematically illustrates an exemplary current profile usable for driving the embedded heater in the package of FIG. 1.

Referring to FIG. 2, the left and right axes respectively plot the electrical current and temperature of the embedded heater; while the X-axis plots the time. The electrical current profile in this example comprises three stages I, II, and II. In stage I, electrical current driven through the embedded heater ramps up from 0 to $I_m$ during time interval $\Delta P_1$-resulting in the temperature of the embedded heater ramping up from $T_0$ to $T_m$. $T_0$ is the temperature of the embedded heater without being powered on. During the packaging process, $T_0$ can be the temperature of the environment in which the packaging process is conducted, such as around the room temperature, or higher than the room temperature due to the heat produced in a previous packaging process. $T_m$ is the desired temperature for melting the solder material, which can be higher than the melting temperature of the solder material, such as 180° C. or higher, more preferably from 200° C. to 300° C., more preferably from 200° C. to 250° C., and more preferably around 220° C.

The ramping time $\Delta P_1$ is selected such that no damages would be caused. This arises from the facts that, too fast ramping rate (too short $\Delta P_1$) may cause crack or deformation to the package lid, or other components of the package. Too low ramping rat (too long $\Delta P_1$), however, is not efficient. Exemplary values of $\Delta P_1$ can be from 10 seconds to 500 seconds, such as from 100 seconds to 400 seconds, and from 200 seconds to 300 seconds.

Temperatures of the embedded heater can be measured by a thermometer such as a thermal resistant. Alternatively, temperatures of the embedded heater can be obtained dynamically by measuring resistances of the embedded heater, in which instance, calibration of the resistance over temperature for the embedded heater may be performed, which will be discussed in detail with reference to FIG. 4 afterwards.

Referring again to FIG. 2, when the temperature of the embedded heater reaches the desired value of $T_m$, the embedded heater is maintained at this desired temperature by maintaining the electrical current at $I_m$ for a time interval of $\Delta P_2$. The value of $\Delta P_2$ is determined such that the solder material is melted; and the package lid is securely bonded to the package substrate with the solder material. On the other hand, no damages are generated due to heating of the embedded heater at temperature $T_m$. For example, if $\Delta P_2$ is too long, too much heat will be applied to the package components including the package lid. Too much heat may result solder grains or vacant in the solder material after bonding. Too much heat can also detach the metallization layer from the top surface of the package substrate, and/or the metallization layer from the bottom surface of the package lid. In addition, too much heat can cause crack or deformation of the package components, such as the package lid. On the other hand, too short heating time $\Delta P_1$ may not fully melt the solder material or guarantee a successful bonding of the package lid to the package substrate. For the above reasons, $\Delta P_2$ can be from 5 to 100 seconds, more preferably from 10 to 50 seconds, and more preferably around 30 seconds.

During time interval $\Delta P_2$, the actual temperature of the embedded heater may not be the desired value of $T_m$ with the electrical current of Im due to many reasons, such as temperature fluctuation, altered initial temperature $T_o$, and temperature variation of the environment in which the packaging process is carried out. This problem can be solved by a temperature control loop. Specifically, the temperature of the embedded heater can be dynamically measured by measuring the resistance of the embedded heater. With a calibration of the resistance to temperature, the electrical current can be modified based on the instantaneously measured resistance and the calibrated resistance corresponding to the desired temperature, such as $T_m$, which will be detailed afterwards with reference to FIG. 4.

After stage II as shown in FIG. 2, the electrical current through the embedded heater is reduced from $I_m$ to 0 within time interval $\Delta P_3$, as plotted in the dashed line in stage II of FIG. 2. Accordingly, the temperature of the embedded heater is reduced from $T_m$ to $T_f$ as shown in the solid line in stage III of FIG. 2. The time interval $\Delta P_3$ is determined such that no damages to the package components are produced; while the package lid and package substrate are securely bonded. If the time interval $\Delta P_3$ is too short, the temperature of the embedded heater ramps down too quick—resulting in large stress in the bonding region, which includes the bonding surface of the package lid, the solder material, and the bonding surface of the package substrate. Such stress may crack or deform the package lid, solder material, and/or the package substrate after bonding. On the other hand, if the time interval $\Delta P_3$ is too long, too much heat will be applied to the bonding region, which will cause the same or similar problems as those may be caused by too long heating of external heater, or too high temperature of the embedded heater as discussed above. Moreover, if the time interval $\Delta P_3$ is too long, large size grains as compared to those would be generated if the time interval $\Delta P_3$ is too short, may be generated in the solder material after bonding. These large size grains may degrade the bonding quality, or even cause bonding failure. For the above reasons, the time interval $\Delta P_3$ can be from 15 seconds to 200 seconds, more preferably from 20 to 160 seconds, and more preferably from 70 to 90 seconds. In other examples, the time interval $\Delta P_3$ can be less than 200 seconds, such as 100 seconds or less, 50 seconds or less, and 30 seconds or less.

As discussed above, the external heater can be used for heating the package lid and maintaining the package lid at the desired temperature. The external heater can be any suitable heaters, such as thermostats and heat resistances. As a way of example, FIG. 3 illustrates an exemplary heater.

Figure 3:
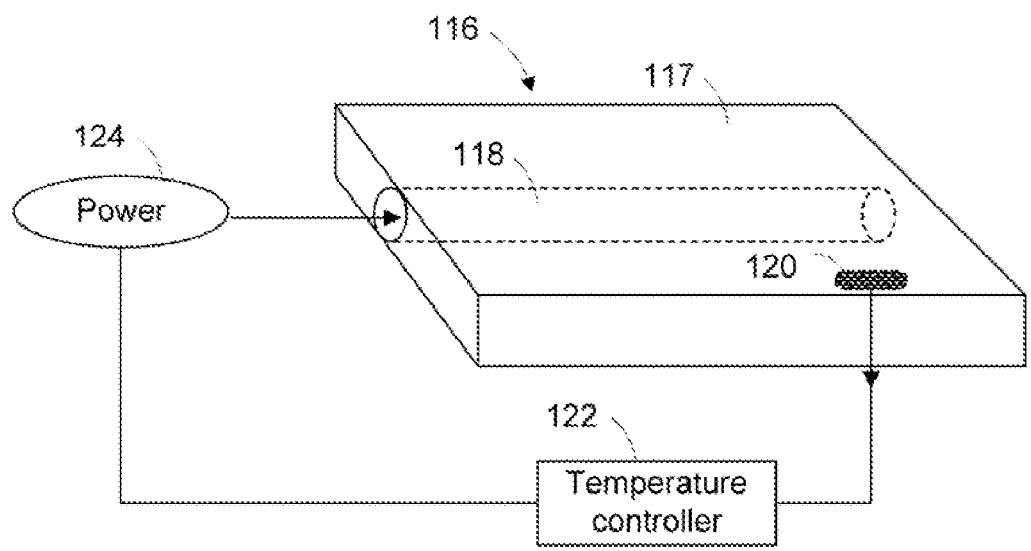
FIG. 3 illustrates an exemplary setup for driving the external heater in FIG. 1.

Referring to FIG. 3, external heater 116 comprises thermal pad 117 that can be a metallic plate. Heat cylinder 118 is disposed within a cavity of the plate. By driving electrical current through the heat cylinder, the thermal pad can be heated to and maintained at the desired temperatures depending on the driving electrical current. The temperature of the thermal pad can be measured by thermal resist 120 disposed on the thermal pad. In the example as shown in FIG. 3, the measured resistance of thermal resistance 120 is fed into temperature controller 122 that is capable of transform the measured resistance to temperature which can be read out. Temperature controller 122 is capable of generating a control signal that is derived based on the measured resistance and a calibrated resistance corresponding to the desired temperature; and sending such derived control signal to power source 124 for dynamically adjusting the output current of the power source. The output current is delivered to the heat cylinder. With this configuration, the temperature of the heat pad can be heated to and maintained at the desired temperature precisely and reliably. Of course, the thermal pad can be in other suitable forms, such as a plastic thermal-pad. The heat cylinder can also take other suitable forms and associated with the heat pad in other suitable ways.

Figure 4:
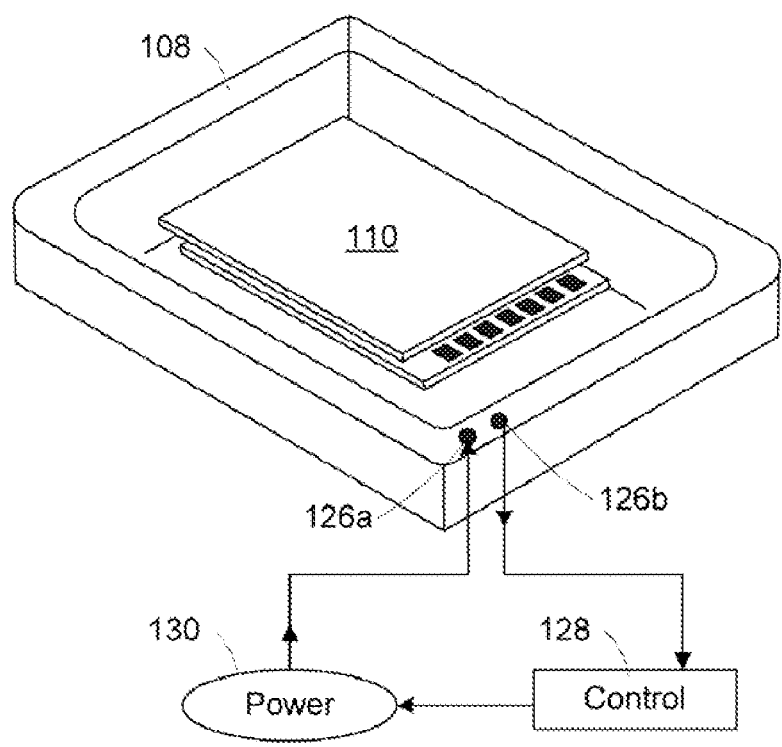
FIG. 4 illustrates an exemplary setup for driving the embedded heater in FIG. 1.

As discussed above, the embedded heater is also desired to be precisely controllable. FIG. 4 illustrates an exemplary setup for operating the embedded heater. As shown in FIG. 4, electronic device 110 is disposed on a supporting surface of package substrate 108 that has embedded heater 102 as shown in FIG. 1. The embedded heater extends two electrical contacts 126a and 126b on a ledge of the package substrate, through which electrical current can be delivered. For delivering electrical current to the heater and precisely control the temperature of the embedded heater during packaging processes, one of the two contacts, such as 126a is connected to a temperature controller, such as temperature controller 122 in FIG. 3, for dynamically measuring the temperature of the embedded heater. Temperature measurements of the embedded heater can be accomplished by measuring the resistance of the embedded heater dynamically during packaging processes, and transforming the measured resistances into temperatures based on a calibration curve. The calibration curve can be obtained from the product specification, or can be obtained by running a standard calibration process.

The measured temperature of the embedded heater is compared to the desired temperature by the temperature controller. Based on the comparison and the calibration curve, a control signal is generated by the temperature controller, and delivered to power source 130 that provides electrical current to the embedded heater through the other contact 126b of the embedded heater. Given the received control signal, the power source may adjust its current output accordingly.

During the packaging process, heat is applied to the bonding regions between the package lid and package substrate by the embedded heater and external heater, as shown in FIG. 1, so as to melt the solder material for bonding. This heat can be dissipated by thermal radiation from the heated components of the package and through thermal conduction from the heated components to the heat exchanger (e.g. heat exchanger 104 in FIG. 1). Heat dissipation is critical in that the region in vicinity of the electronic device is desired not to exceed the tolerant temperature of the electronic device. In one example, the temperature of the region in the vicinity of the electronic device during the packaging process can be controlled through the heat exchange. Specifically, the temperature of the region can be reduced by reducing the temperature of the heat exchanger.

Figure 5:
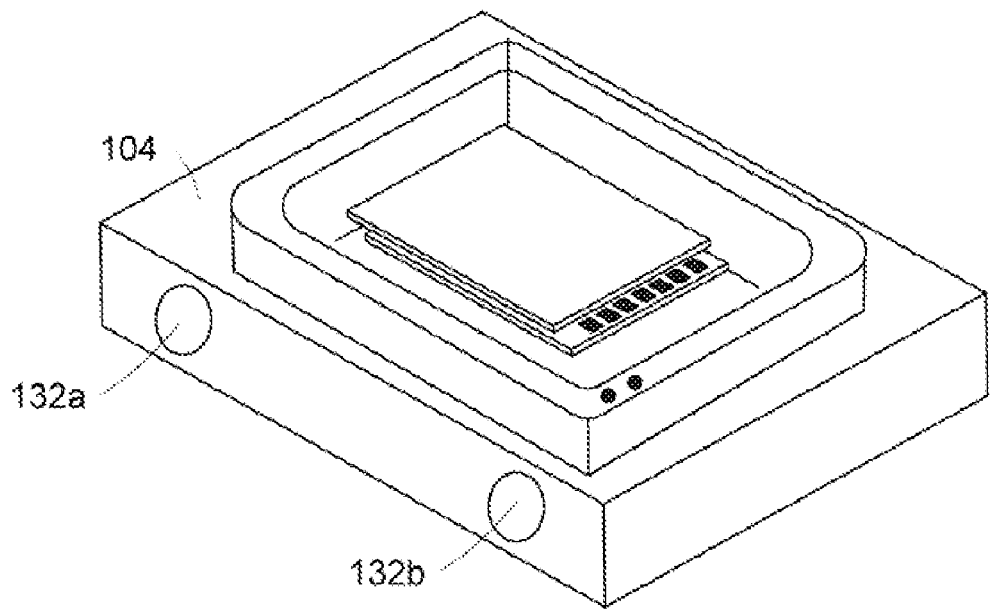
FIG. 5 illustrates an exemplary heat exchanger for controlling the temperature of the package substrate.

The heat exchanger can be in any suitable forms, one of which is illustrated in FIG. 5. Referring to FIG. 5, heat exchanger 104 can be composed of a material of high thermal conductivity, such as a metallic plate (e.g. cupper and aluminum). Cooling of the heat exchanger can be accomplished through many ways, such as liquid-cooling with a cooling liquid (e.g. water) and with or without a circulation loop. In the example as shown in FIG. 5, the metallic plate comprises inlet 132a and outlet 132b, through which cooling water can be introduced through the metallic plate. By controlling the temperature of the cooling liquid, the temperature of the metallic plate can be controlled. Of course, other suitable cooling mechanisms can also be employed.

Figure 6:
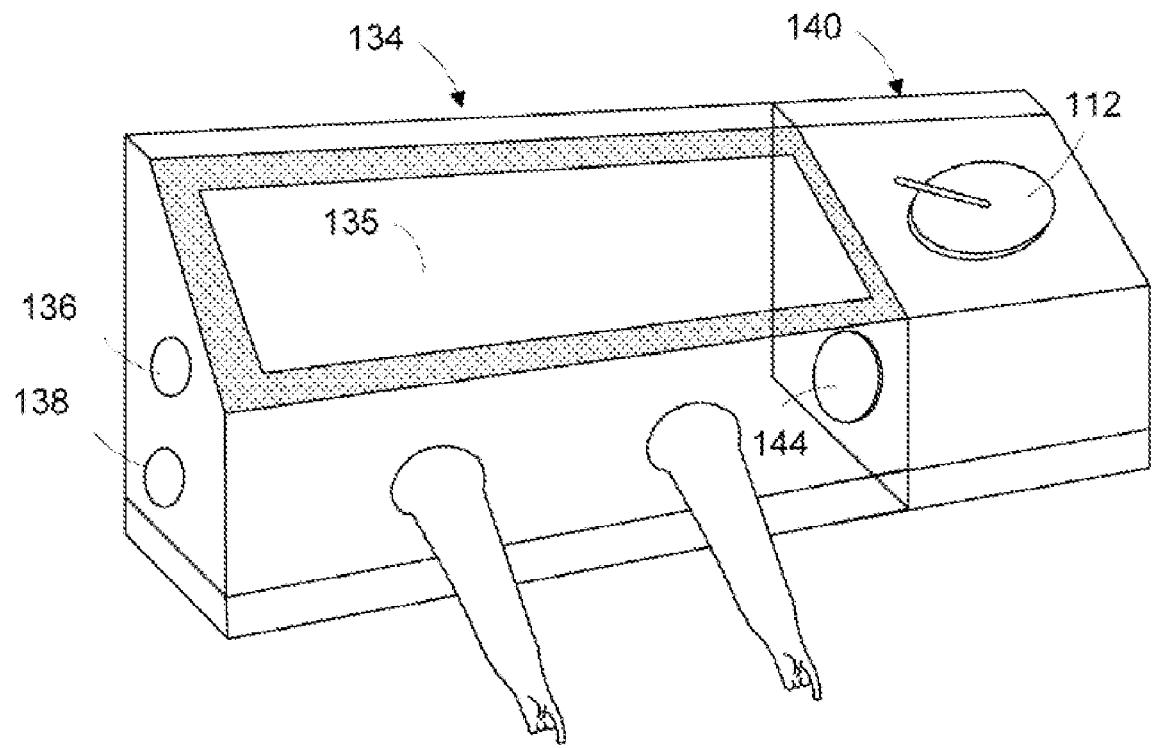
FIG. 6 schematically shows a glove box.

The packaging process discussed herein can be performed in an enclosed environment such as a glove box, even though not required. Advantages thereof can be obvious. For example, the packaging environment and packaging parameter can be controlled, as well as satisfying other specific requirements, such as clean-room. As a way of example, FIG. 6 illustrates an exemplary glove box in which the packaging process can be performed. Glove box 134 comprises a packaging space surrounded by box walls, one of which is preferably glass for visually monitoring the packaging process (e.g. glass wall 135). The glove box can be filled with a protection gas, which is preferably an inert gas, such as $N_2$, He, Ar, Xe, and other suitable gasses. In one example, the glove box is filled with nitrogen mixed with trace element gas of helium. Nitrogen gas inside the glove box can be 80% or more, such as 90% or more, and 98% or more; and helium gas can be 20% or less, 10% or less, and 2% or less. Helium gas can be used for evaluating the bonding quality of the package by detecting the trace element of helium. Of course, other gases can be used for leaking detection.

Some of the electronic devices may be sensitive to moistures, particles, and specific gaseous elements, such as oxygen during packaging and/or operation. For example, micromirror devices are very sensitive to contamination, such as moisture and dust, as well as oxygen. For this reason, it is preferred that oxygen inside the glove box is 10 ppm or les; and $H_2O$ is 10 ppm or less. The temperature inside the glove box is preferably 80° C. or less, such as 60° C. or less, 40° C. or less, 20° C. or less, but preferably higher than 0 degree.

The pressure of the glove box can be higher or less than one atmosphere, more preferably higher than one atmosphere, such as from 1 to 1.5 atm, more preferably from 1 to 1.1 atm, and more preferably around 1.05 atm. A benefit thereof is that the internal protection gas blows outwards in the accident of leak in the glove box so as to maintain the desired environment inside the glove box.

The protection gas sources and other desired courses, such as cooling liquid and electrical cables can be connected to the elements in the glove box through inlets on the wall of the box, such as inlets 136 and 138. In order to maintain the desired operation environment in the glove box, the inlets in the wall of the box are preferably sealed to avoid leaking.

The glove box can be companioned by load-lock 140. The load-lock may comprise door 142 open to the exterior environment allowing for loading the devices to be processed. Interior door 144 of the load-lock connected the load-lock to the glove box through which the devices to be processed can be transferred from the load-lock to the glove box. The load-lock may have other functions. For example, the load-lock can be provided with heating mechanisms for backing the devices before transferring to the glove box for packaging. In another example, the load-lock can be connected to other processing units, such as etching chambers in which devices can be released by removing the sacrificial materials, anti-stiction treatment chambers in which anti-stiction materials can be applied to the devices, and other device processing units.

The glove box can also be provided with a pump or a circulation loop having circulation pump for adjusting the pressure within the glove box, which will not be discussed in detail herein.

As discussed above, a trace element (e.g. helium gas) may be introduced into the glove box for performing leak checking of the packaged device, in addition to the protection gas (e.g. nitrogen). However, when the pressure inside the glove box is higher than the pressure in the container containing the trace element, the trace element may not be introduced into the glove box. For this reason, and also to precisely control the amount of the trace element inside the glove box, a feeding mechanism is provided, as shown in FIG. 7.

Figure 7:
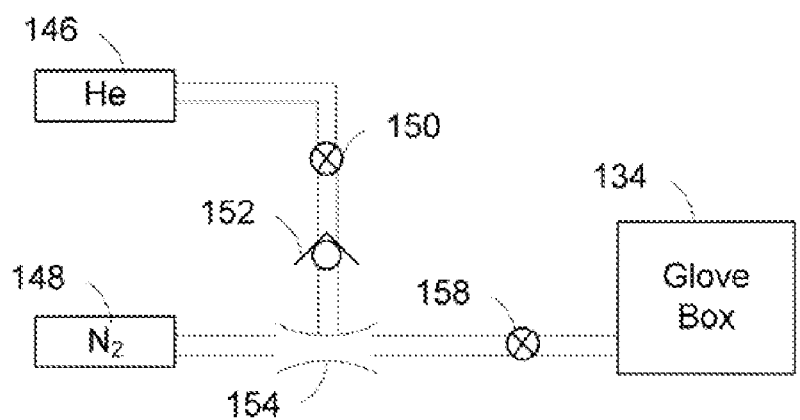
FIG. 7 illustrates a diagram showing a method for introducing protection gases and trace gases into the glove box during packaging in FIG. 6.

Referring to FIG. 7, containers 146 and 148 respectively contain helium and nitrogen gases. Nitrogen gas flows into glove box 134 through eductor 154 and valve 158. Trace element of helium gas flows to the glove box via needle valve 150, check valve 152, eductor 154, and valve 158.

In a packaging process, helium and nitrogen are introduced into the glove box with the desired ratio through valve 158, check valve 152, and needle valve 150 so as to reach an equilibrium state. At the equilibrium state, eductor stops helium to pass through, while remains open for nitrogen. During the packaging process, valve 158, check valve 152, and needle valve 150 are left open. At a time when nitrogen is below the desired pressure, nitrogen in the nitrogen container can flow into the glove box freely to compensate the deficiency of nitrogen. When helium is below the desired amount, the pressure balance between helium and nitrogen is broken. At eductor 154, pressures of helium and nitrogen are not balanced. The unbalanced pressure forces the eductor to open—allowing helium to pass through and flow into the glove box through valve 158.

Figure 8:
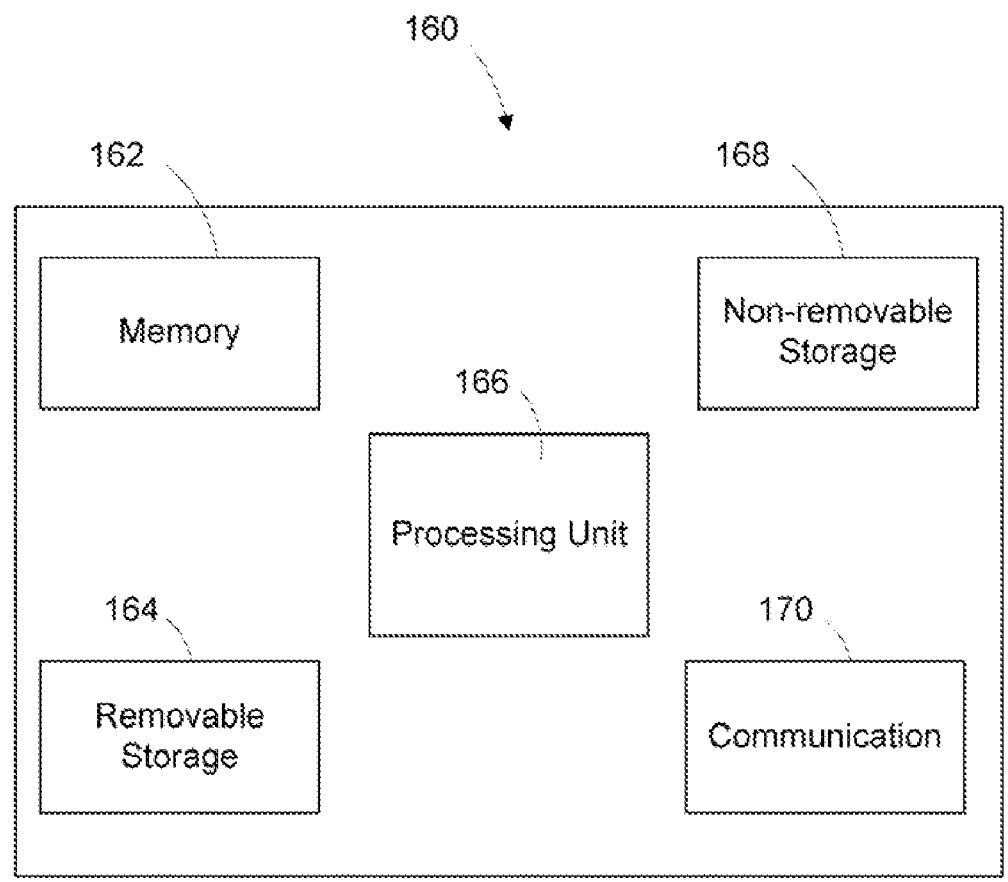
FIG. 8 is a diagram showing a computing system in which the controlling mechanisms of the method can be implemented.

In one example, the packaging process can be performed with the aid of a computing device, in which operations, such as temperature controls of the heaters, measurements of the resistances, and other operations such as user interfaces through which operation parameters can be set, data storage/retrieving, and data analyses can be implemented into functional modules of the computing device. As a way of example, FIG. 8 schematically illustrates one exemplary computing device for implementing the functional modules associated with the packaging disclosed herein. Although such devices are well known to those of skill in the art, a brief explanation will be provided herein for the convenience of other readers.

Referring to FIG. 8, in its most basic configuration, computing device 160 typically includes at least one processing unit 166 and memory 162. Depending on the exact configuration and type of computing device, memory 162 can be volatile (such as RAM), non-volatile (such as ROM, flash memory, etc) or some combination of the two.

Additionally, device 160 may also have other features and/or functionality. For example, device 160 could also include additional removable and/or non-removable storage including, but not limited to, magnetic or optical disks or tape, as well as writable electrical storage media. Such additional storage is illustrated in FIG. 8 by removable storage 164 and non-removable storage 168. Computer storage media includes volatile and nonvolatile, removable and non-removable media implemented in any method or technology for storage of information such as computer readable instructions, data structures, program modules or other data. The memory, the removable storage and the non-removable storage are all examples of computer storage media. Computer storage media includes, but is not limited to, RAM, ROM, EEPROM, flash memory or other memory technology, CDROM, digital versatile disks (DVD) or other optical storage, magnetic cassettes, magnetic tape, magnetic disk storage or other magnetic storage devices, or any other medium which can be used to store the desired information and which can accessed by the device. Any such computer storage media may be part of, or used in conjunction with, the device.

The device may also contain one or more communications connections 170 that allow the device to communicate with other devices. The communications connections carry information in a communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. As discussed above, the term computer readable media as used herein includes both storage media and communication media.

For facilitating the automatic control of the measurements system for executing the desired measurement procedures with the computing device, a set of User-Interfaces (UI) can be provided so as to allow control of the elements used in the packaging process.

In the following, the packaging method will be exampled in a packaging process for a micromirror array device. It will be appreciated by those skilled in then art that the following discussion is for demonstration purposes only, and should not be interpreted as a limitation.

Figure 9:
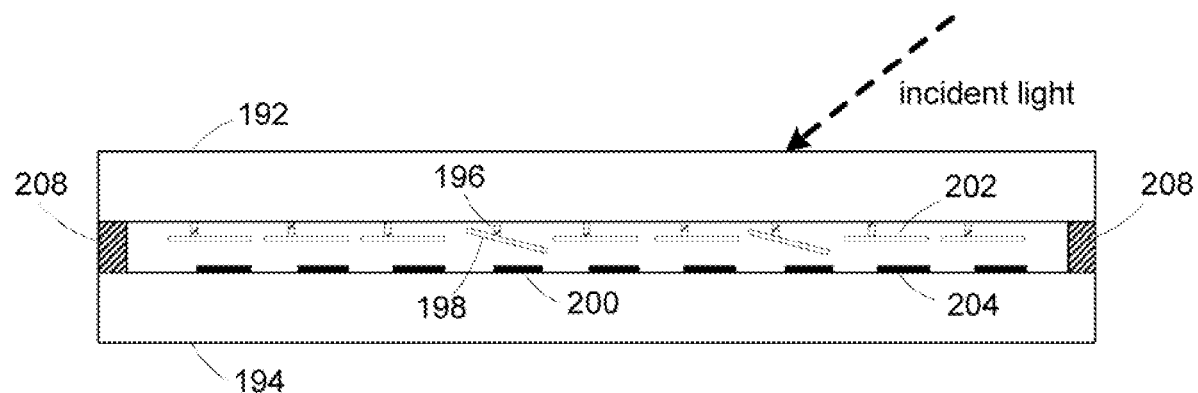
FIG. 9 is a cross-sectional view of an exemplary micromirror device to be packaged using the packaging method.

Micromirror devices are a type of microstructure devices. A typical micromirror array device comprises an array of micromirror devices each of which comprises a reflective and deflectable mirror plate capable of reflecting incident light. A typical micromirror device has a characteristic dimension of 200 microns or less, or 100 microns or less. As a way of example, FIG. 9 illustrates an exemplary micromirror array device that can be used in the display systems for projecting desired images. This type of micromirror array devices is often referred to as "spatial light modulators."

FIG. 9 illustrates a cross-sectional view of an exemplary spatial light modulator having an array of micromirror devices. For simplicity purposes, only nine micromirror devices are illustrated. In general, the micromirror array of a spatial light modulator may consist of thousands or millions of micromirrors, the total number of which determines the resolution of the displayed images. For example, the micromirror array of the spatial light modulator may have 640×480 (VGA) or more, such as 800×600 (SVGA) or more, 1024× 768 (XGA) or more, 1280×1024 (SXGA) or more, 1280×720 or more, 1400×1050 or more, 1600×1200 (UXGA) or more, and 1920×1080 or more, or even larger number of micromirrors. In other applications, the micromirror array may have less number of micromirrors.

The diameter of the micromirror array is preferably from 0.55 inch to 0.8 inch, more preferably from 0.65 to 0.85 inch, and more preferably around 0.7 inch. The micromirror devices each have a characteristic dimension in the order of microns, such as 100 micros or less, 50 microns or less, and 15 microns or less. The micromirror devices are arranged in arrays preferably with a pitch of 10.16 microns or less, such as from 4.38 to 10.16 microns. The gap between the adjacent micromirror devices is preferably 1.5 microns or less, such as 1 micron or less, 0.5 micron or less, more preferably from 0.1 to 0.5 micron, as set forth in U.S. patent applications Ser. No. 10/627,302 filed Jul. 24, 2003, the subject matter being incorporated herein by reference in entirety.

As shown in FIG. 9, each micromirror device comprises a reflective deflectable mirror plate (e.g. mirror plate 198) attached to a deformable hinge that is held by a post (e.g. post 196) formed on a substrate (e.g. substrate 192). With such configuration, the mirror plate is capable of rotating relative to the substrate (e.g. substrate 192) on which the mirror plate is formed. The rotation (deflection) of the mirror plate is accomplished through an addressing electrode (e.g. addressing electrode 200) that is placed proximate to and associated with the mirror plate. The addressing electrode can be formed on substrate 194 that is a semiconductor substrate on which standard integrated circuits and semiconductor devices can be fabricated. In operation, electrical voltages are applied to the mirror plate and the associated addressing electrode so as to generate an electrostatic field between the mirror plate and addressing electrode. Such electrostatic field yields an electric force having a strength determined upon many factors, such as the magnitude of the voltage differences between the mirror plate and addressing electrode and the vertical distance between the mirror plate and addressing electrode. The electrostatic force causes an electrostatic torque to the mirror plate, and deflecting the mirror plate relative to the substrate (e.g. substrate 192). By adjusting the magnitude of the voltage applied to the addressing electrode, different rotation angles of the mirror plate can be achieved. For example, given the mirror plates 198 and 202 at the same voltage, different voltages on addressing electrodes 200 that is associated with mirror plate 196; and on addressing electrode 204 that is associated with mirror plate 202 results in different rotation (deflection) positions of mirror plates 198 and 202.

In the example shown in FIG. 9, the array of mirror plates are formed on substrate 192 that is transmissive to visible light; and the array of addressing electrodes are formed on substrate 194 that is a standard semiconductor substrate. The two substrates can be bonded together using a bonding material, such as a spacer 1208 so as to maintain a constant and uniform distance between the mirror plates and addressing electrodes that are enclosed within the gap between the two substrates.

Figure 10:
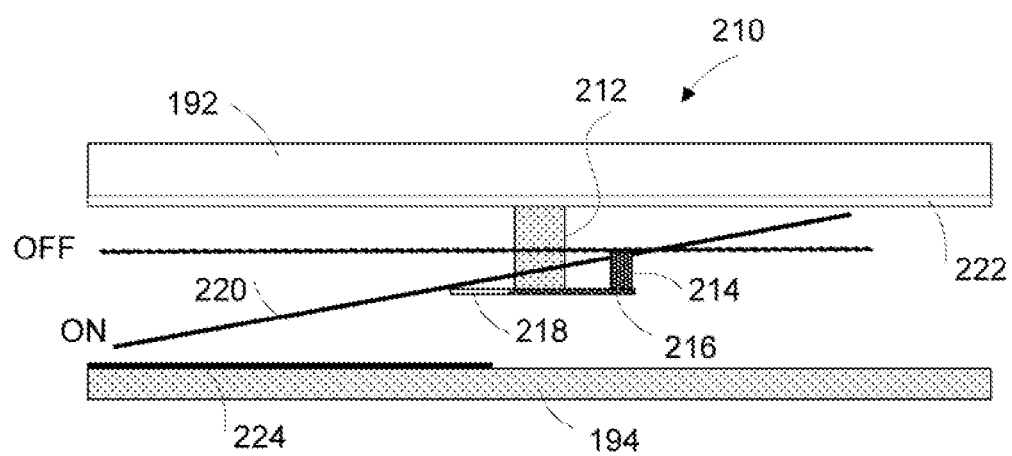
FIG. 10 is a cross-section view of a micromirror device of the micromirror array device of FIG. 9.

The micromirror device of the spatial light modulator is better illustrated in FIG. 10. Referring to FIG. 10, micromirror device 210 comprises light transmissive substrate 192 and semiconductor substrate 194. Post 212 is formed on substrate 192. Deformable hinge 216 is connected to and held by the post on substrate 192. Reflective deflectable mirror plate 220 is attached to the deformable hinge via hinge contact 214 such that the mirror plate is deflectable relative substrate 192. For deflecting the mirror plate, addressing electrode 224 on substrate 194 is placed proximate to the mirror plate such that the electrostatic field can be established between the mirror plate and the addressing electrode.

The micromirror as shown in FIG. 10 may have other alternative features. For example, light transmissive electrode 130 for deflecting the mirror plate towards substrate 192 can be provided. For preventing unintentional electrical short between the mirror plate and the addressing electrode (224), such as the end of the mirror plate and addressing electrode when the mirror plate is deflected towards substrate 192 (the ON state as shown in the figure), a light transmissive and electrically conductive layer may be coated on the light transmissive electrode 222. Alternative to the light transmissive electrode, optical films for improving the optical properties, such as an anti-reflection film for enhancing the transmission of the incident light (e.g. visible light); and light blocking/ absorbing materials (e.g. in the form of strip, frame, segments, or combinations thereof) can be coated on the light transmissive substrate 192.

The mirror plate can be attached to the deformable hinge via hinge contact wherein the contact point is away from the mass center of the mirror plate such that the rotation axis along which the mirror plate rotates is not coincident with any diagonals of the mirror plate (but may or may not be parallel to a diagonal of the mirror plate); and the mirror plate is thus capable of rotating asymmetrically. That is, the maximum achievable angle (e.g. the ON state angle) of the mirror plate rotating in one direction is larger than that (e.g. the OFF state angle) of the mirror plate in rotating along the opposite direction. Alternatively, the mirror plate can be attached to the deformable hinge such that the mirror plate is capable of rotating symmetrically—that is the maximum achievable angles in both directions are substantially the same. This can be accomplished by attaching the mirror plate to the deformable hinge at an attachment point that is substantially at the mass center of the mirror plate, which is not shown in the figure.

Regardless of whether the attachment point is at or away from the mass center of the mirror plate, the mirror plate and deformable hinge can be formed on different planes when the mirror plate is not deflected. That is, the mirror plate and deformable hinge form a gap along the normal direction of the mirror plate when the mirror plate is not deflected, as that shown in the figure. Alternatively, the mirror plate and deformable hinge can be formed on the same plane. In particular, the mirror plate and deformable hinge can be derived from a same material. For example, the mirror plate and hinge can be derived from a single crystal, such as single crystal silicon.

Stopping mechanisms, such as stopper 218 can be alternatively provided for limiting the rotations of the mirror plate when the mirror plate rotates to desired angles. For example, stopper 218 in the figure stops the rotation of the mirror plate when the mirror plate rotates to the desired ON state angle, such as 100 degrees or more, or 12° degrees or more, or 14° degrees or more, and 16° degrees or more. Of course, other stoppers can be alternatively provided, for example, a stopper for defining the OFF state of the mirror plate. In other examples, substrates 192 and 194 can be functioned as stoppers.

As an alternative feature, only one single addressing electrode (e.g. addressing electrode 224) is associated with each mirror plate for deflecting the mirror plate according to the image data of desired images (e.g. bitplane data). Such addressing electrode is preferably, but not required, placed such that the addressing electrode extends beyond the furthest point of the mirror plate from the mass center of the mirror plate when the mirror plate is not deflected.

In the examples shown in FIG. 9 and 10 the mirror plates and addressing electrodes are formed on separate on separate substrates (e.g. semiconductor substrate 194 and light transmissive substrate 192), alternatively, the mirror plate and addressing electrode can be formed on the same substrate, such as the semiconductor substrate (e.g. substrate 194).

The micromirror devices as discussed above can be fabricated in many ways, as those set forth in U.S. Pat. No. 5,835, 256 issued Nov. 10, 2003, U.S. patent applications Ser. No. 10/005,308, filed Dec. 3, 2001, Ser. No. 10/005,308 filed Dec. 3, 2001, Ser. No. 10/343,307 filed Jan. 29, 2003, Ser. No. 10/366,296 filed Feb. 12, 2003, Ser. No. 10/366,297 filed Feb. 12, 2003, Ser. No. 10/607,687 filed Jun. 27, 2003, Ser. No. 10/613,379 filed Jul. 3, 2003, Ser. No. 10/437,776 filed May 13, 2003, Ser. No. 10/698,563 filed Oct. 30, 2003, Ser. No. 10/875,987 filed Jun. 23, 2004, Ser. No. 10/875,602 filed Jun. 23, 2004, Ser. No. 10/875,555 filed Jun. 23, 2004, Ser. No. 10/875,760 filed Jun. 23, 2004, Ser. No. 11/102,531 filed Apr. 8, 2005, Ser. No. 11/102,082 filed Apr. 8, 2005, Ser. No. 11/110,338 filed Apr. 19, 2004, Ser. No. 11/109,994 filed Apr. 19, 2005, and Ser. No. 11/110,557 filed Apr. 19, 2005, the subject matter of each being incorporated herein by reference in entirety.

Figure 11:
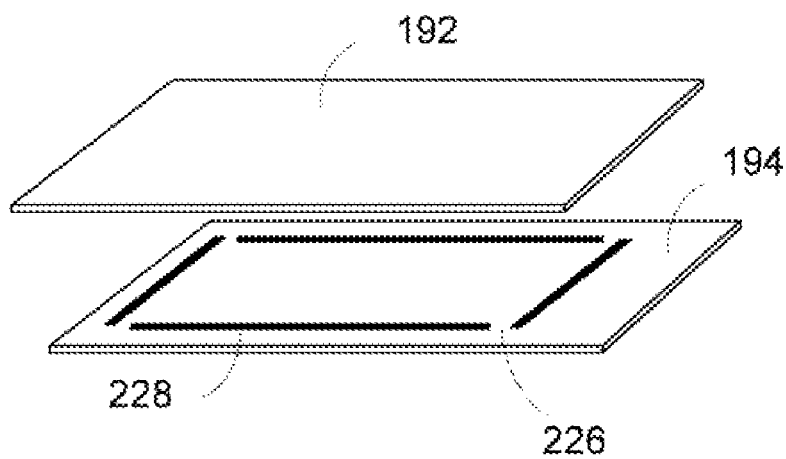
FIG. 11 illustrates a perspective view of the micromirror array device of FIG. 9.

The fabrication may or may not be on the wafer level. After fabrication, specifically, after releasing the reflective and deflectable mirror plates of the micromirrors, the micromirrors having the reflective mirror plates on the light transmissive substrate is assembled to the semiconductor substrate having formed thereon an array of addressing electrodes. An exemplary assembly (which may or may not be on the wafer level) is illustrated in FIG. 11. Referring to FIG. 11, light transmissive substrate 192 having the array of deflectable and reflective mirror plates of the micromirror assembly is bonded to semiconductor substrate 194 having an array of addressing electrodes with bonding material 228. The bonding material is dispensed around the circumference of substrate 194 (or alternatively on substrate 192 or both). The bonding material may or may not be a continuous line around the circumference of the device. Discontinuities in the dispensed bonding material create micro-openings, such as micro-opening 226, in the assembled device. The smaller dimension of a micro-opening is around 10 micrometers or less, or 5 micrometers or less. In other examples, the micro-openings may have a larger size, such as 10 micrometers or more. During the bonding process, the bonding material may outgas or creep, and light organic components (e.g., solvents) will adsorb or diffuse onto the surfaces of the micromirror assembly, creating a contaminated layer. As a result of the bonding, the micromirrors formed on substrate 192 and the addressing electrodes and circuitry on substrate 194 are partly enclosed within the assembly of the substrates and the bonding material.

Figure 12:
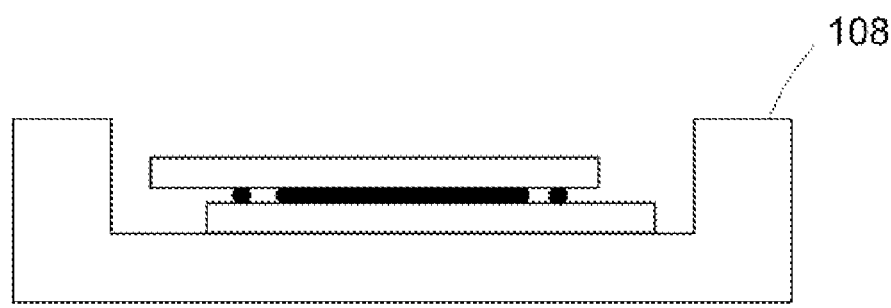
FIG. 12 illustrates a cross-section view of the micromirror array device in FIG. 11 in a package substrate.
Figure 13:
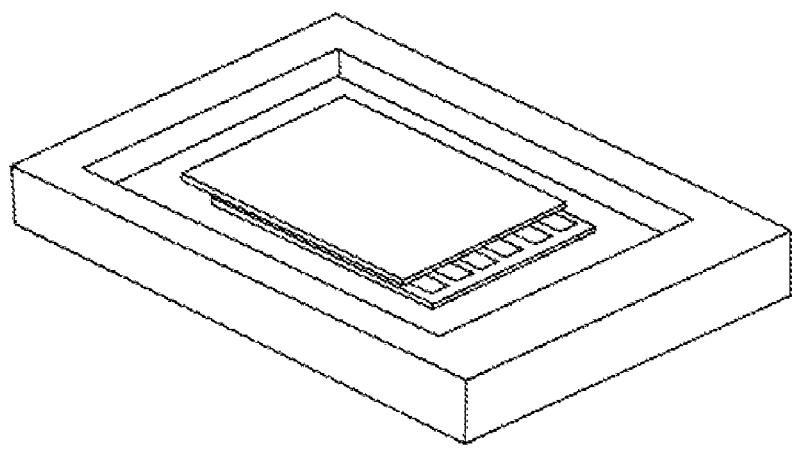
FIG. 13 illustrates a perspective of FIG. 12.

For protecting the micromirror devices, the assembly needs to be enclosed within a package. The packaging process starts from attaching the micromirror assembly into package substrate 108, as shown in FIG. 12. The package substrate can be the one as discussed above with reference to FIG. 1. A perspective view of the package in FIG. 12 is illustrated in FIG. 13. After attaching the micromirror array device (micromirror assembly) on the package substrate, the packaging process as discussed above is performed. As a way of example, FIG. 14 shows the steps executed in an exemplary packaging process.

Figure 14:
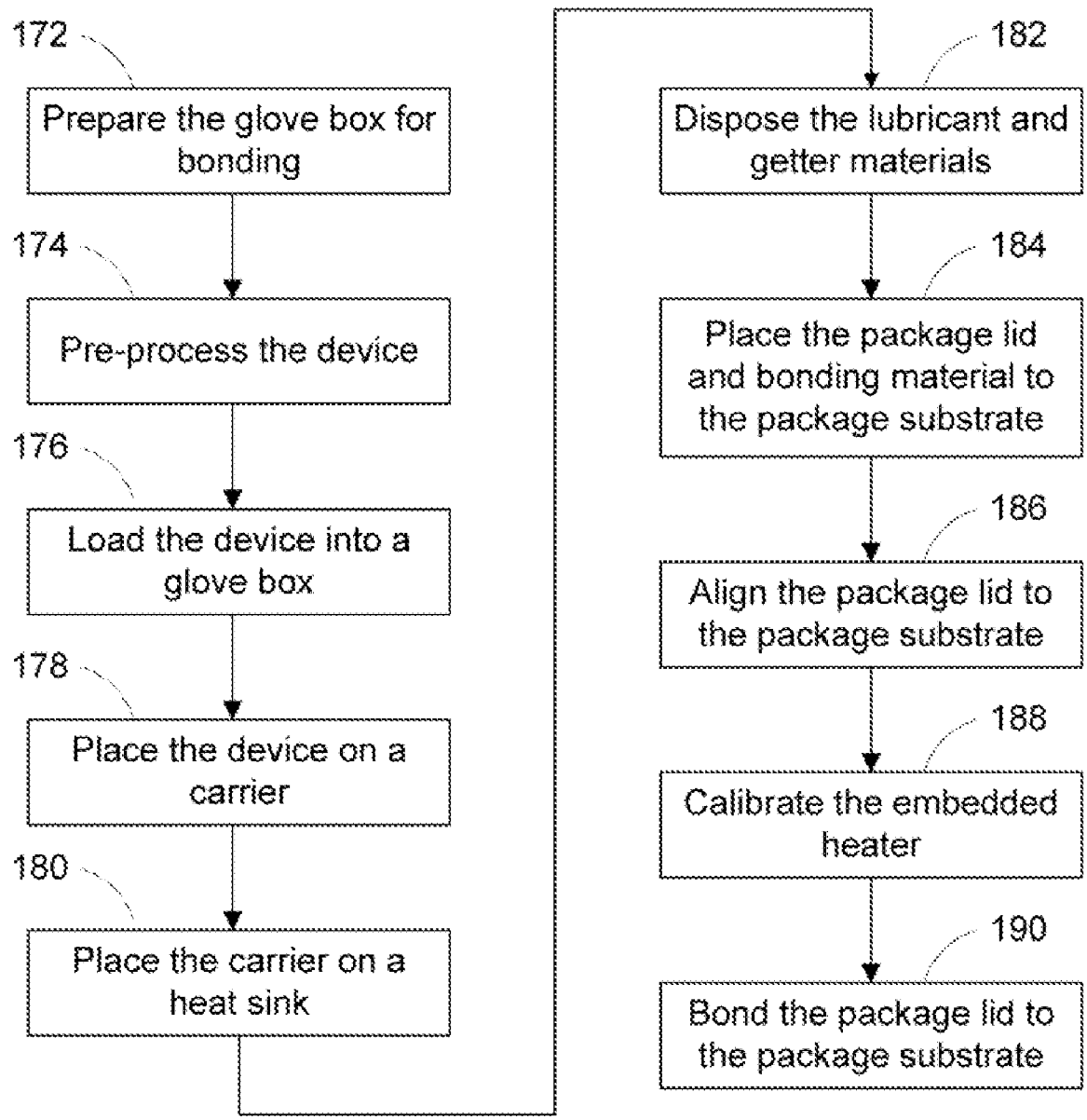
FIG. 14 is a flow chart showing the steps executed in an exemplary packaging process for packaging the micromirror array device in FIG. 13.

Referring to FIG. 14, the glove box, in which the packaging process is to be performed, is prepared (step 172). In this step, the glove box can be purged with the desired working gasses, such as inert gasses (e.g. nitrogen and helium). Desired sources, such as electrical power sources, cooling liquid (e.g. water), and gas sources (e.g. nitrogen and helium) are connected to the glove box, preferably with vacuum sealing. In one example, the glove box is filled with nitrogen and helium. The nitrogen gas inside the glove box can be 80% or more, such as 90% or more, and 98% or more; and helium gas can be 20% or less, 10% or less, and 2% or less. The oxygen gas inside the glove box is 10 ppm or les; and $H_2O$ is 10 ppm or less. The temperature inside the glove box is preferably 80° C. or less, such as 60° C. or less, 40° C. or less, 20° C. or less, but preferably higher than 0 degree. The pressure of the glove box can be from 1 to 1.5 atm, more preferably from 1 to 1.1 atm, and more preferably around 1.05 atm. The external hater is powered on so as to reach a temperature of from 180° C. to 350° C., more preferably from 200° C. to 250° C., and more preferably from 210° C. to 240° C., and more preferably around 230° C.

Before, during, or even after the step of preparing the glove box, the micromirror array device is prepared for packaging (step 174). For example, the micromirror array device can be cleaned, baked for dehydrogenation, or treated with anti-stiction agent. In a particular example, the micromirror array device can be baked in a vacuum load-lock oven, such as load-lock 140 in FIG. 6 but provided with heating means proper for baking the micromirror array device.

The prepared micromirror array device is loaded into the glove box, preferably from the load-lock (e.g. load-lock 140 in FIG. 6) (step 176). The micromirror array device is placed and preferably securely locked on a carrier that can be a metallic plate (step 178). Between the package substrate and the carrier, a thermal pad, as discussed with reference to FIG. 1, can be provided for enhancing the thermal conduct between the package substrate and carrier. The carrier is then attached to the heat sink (step 180).

Before fully enclosing the micromirror array device in the package, a lubricant material and/or a getter can be alternatively disposed within the package, such as in the vicinity of the micromirror array device in the package substrate (step 182). The package lid is then placed on the package substrate (step 184). The package lid and/or the package substrate is applied with the selected sealing medium and/or the metallization materials, as discussed above with reference to FIG. 1 to FIG. 3. The package lid is aligned to the package substrate (step 186). Such alignment can be accomplished using aligning marks on the package lid and package substrate, or any other suitable methods, which will not be detailed herein.

The aligned package lid and package substrate are then hermetically bonded together by applying heat from both of the external heater and embedded heater. For driving the electrical current through the embedded heater to achieve the desired temperature of the embedded heater, resistance of the embedded heater can be measured (step 188) so as to calibrate the specific embedded heater in the specific package substrate. The measured resistance of the embedded heater is calibrated with a given calibration curve, which results in a starting temperature of the embedded heater. Such calibrated starting temperature can be used as the base temperature in temperature controlling during the following heating process of the packaging process, as that discussed with reference to FIG. 4.

With the calibrated resistance and temperature, electrical current complying with the predetermined current profile as shown in FIG. 2 is driven through the embedded heater (step 190); and the external heater can be simultaneously applied to the package lid. At the same time, external pressure can be applied to the package lid to enhancing the bonding. Alternatively, electrical pads for dynamically measuring the resistance and temperature of the embedded heater are connected to the electrical contacts of the embedded heater so as to dynamically monitoring and controlling the temperature of the embedded heater.

Figure 15:
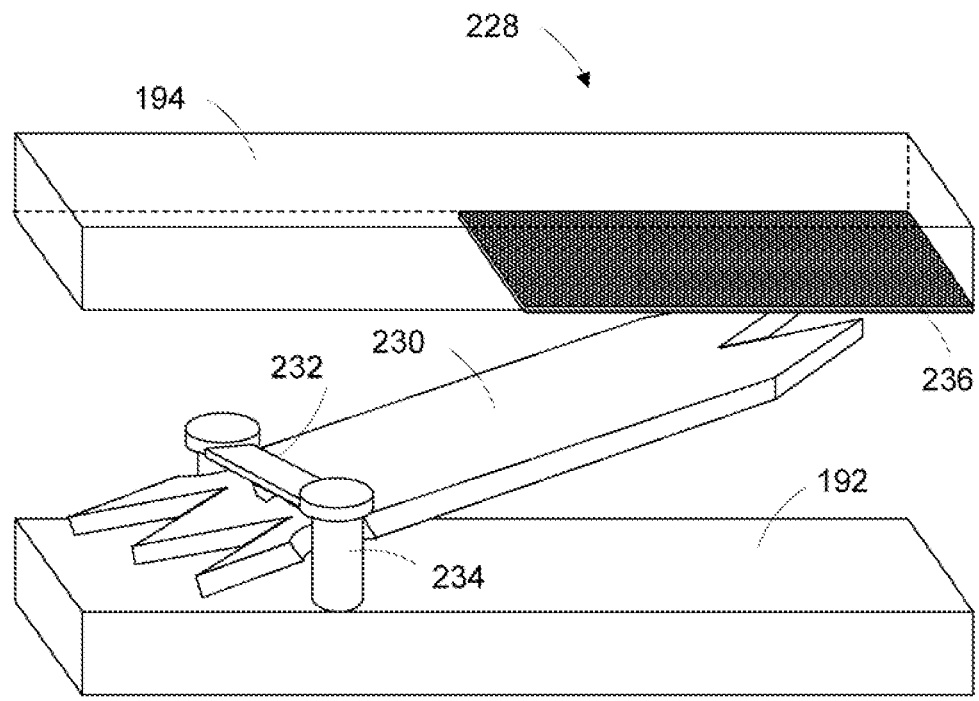
FIG. 15 illustrates a perspective view of an exemplary micromirror device with the cross-sectional view of FIG. 10.

The micromirror device as illustrated in FIG. 10 may have different configurations, one of which is illustrated in FIG. 15. Referring to FIG. 15, micromirror device 228 comprises substrate 192 that is a light transmissive substrate such as glass, quartz, and sapphire and semiconductor substrate 194, such as silicon substrate. Deflectable and reflective mirror plate 230 is spaced apart and attached to deformable hinge 232 via a hinge contact. The deformable hinge is affixed to and held by posts 234. The semiconductor substrate has addressing electrode 236 for deflecting the mirror plate.

In the particular example as shown in FIG. 15, deformable hinge 232 is not along a diagonal or a symmetrical axis of mirror plate 130. Instead, the deformable hinge is offset from the symmetrical axis of the mirror plate such that the mirror plate is operable to rotate asymmetrically. The deformable hinge is located beneath the mirror plate in the direction of the incident light. That is, the mirror plate is located between the light transmissive substrate and the deformable hinge such that the deformable hinge is not illuminated by the incident light so as to prevent unexpected light scattering from the deformable hinge, thereby, increasing the contrast ratio of the produced image. The quality of the produced image is further improved through reduction of the light scattering from the edges of the mirror plate by forming the edges of the mirror plate into a zigzag shape, as shown in the figure.

The deflectable and reflective mirror plate can be a multi-layered structure. For example, the mirror plate may comprise an electrical conducting layer, a reflective layer that is capable of reflecting 85% or more, or 90% or more, or 85% or more, or 99% or more of the incident light (e.g. incident visible light), a mechanical enhancing layer that enhances the mechanical properties of the mirror plate. An exemplary mirror plate can be a multilayered structure comprising a $SiO_2$ layer, an aluminum layer, a titanium layer, and a titanium nitride layer. When aluminum is used for the mirror plate; and amorphous silicon is used as the sacrificial material, diffusion between the aluminum layer and the sacrificial material may occur. This can be avoided by depositing a barrier layer therebetween.

Figure 16:
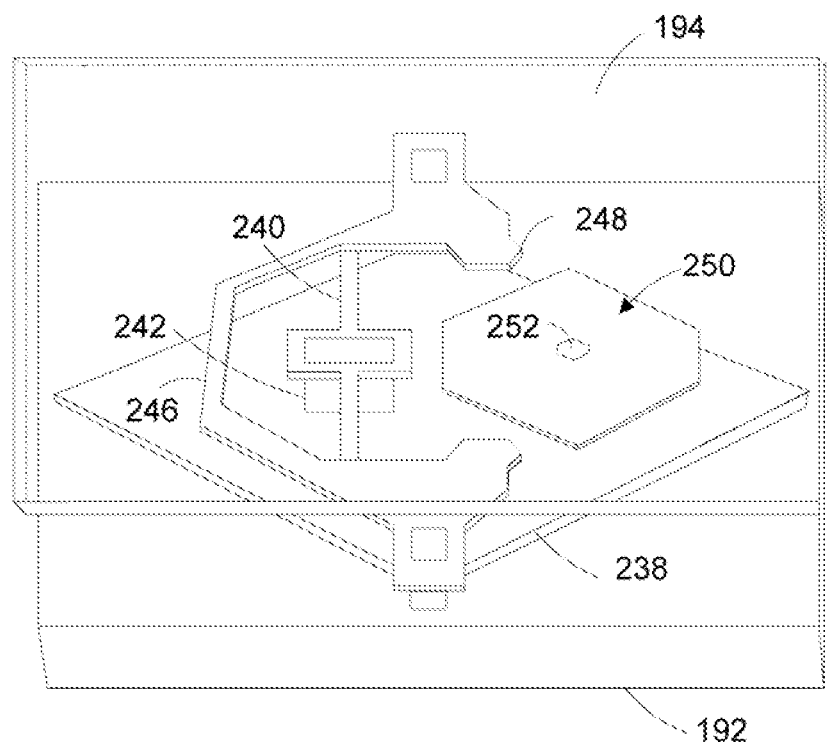
FIG. 16 illustrates a perspective view of another exemplary micromirror device with the cross-sectional view of FIG. 10.

Another exemplary micromirror device is illustrated in its perspective view in FIG. 16. Referring to FIG. 16, deflectable reflective mirror plate 238 with a substantially square shape is formed on light transmissive substrate 192, and is attached to deformable hinge 240 via hinge contact 242. The deformable hinge is held by hinge support 246, and the hinge support is affixed and held by posts on the light transmissive substrate. For electrostatically deflecting the mirror plate, an addressing electrode (not shown in the figure for simplicity purposes) is fabricated in the semiconductor substrate 194. For improving the electrical coupling of the deflectable mirror plate to the electrostatic field, extending metallic plate 248 can be formed on the mirror plate and contacted to the mirror plate via post 252.

Similar to that shown in FIG. 15, the deformable hinge is preferably formed beneath the deflectable mirror plate in the direction of the incident light so as to avoid unexpected light scattering by the deformable hinge. For reducing unexpected light scattering of the mirror plate edge, the illumination light is preferably incident onto the mirror plate along a corner of the mirror plate.

Figure 17:
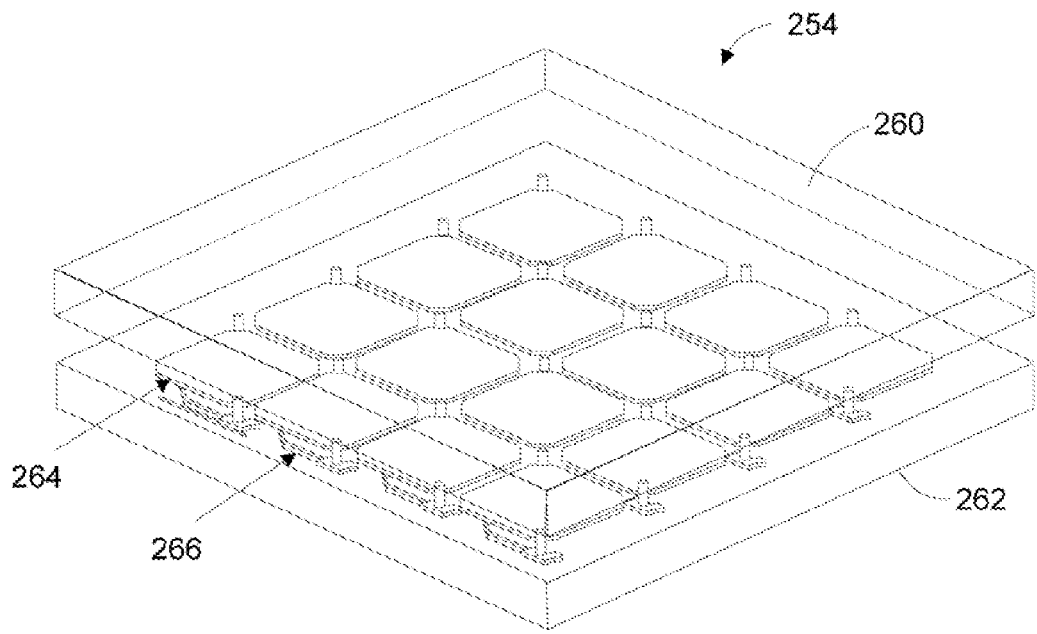
FIG. 17 is a perspective view of an exemplary micromirror array device of FIG. 9.

Referring to FIG. 17, an exemplary spatial light modulator having an array of micromirrors of FIG. 16 is illustrated therein. For simplicity purposes, only 4×4 micromirrors are presented. In general, the micromirror array of a spatial light modulator consists of thousands or millions of micromirrors, the total number of which determines the resolution of the displayed images. For example, the micromirror array of the spatial light modulator may have 1024×768 or more, 1280×720 or more, 1400×1050 or more, 1600×1200 or more, 1920×1080 or more, or even larger number of micromirrors. In other applications, the micromirror array may have less number of micromirrors.

In this example, the array of deflectable reflective mirror plates 264 is disposed between light transmissive substrate 260 and semiconductor substrate 262 having formed thereon an array of addressing electrodes 266 each of which is associated with a mirror plate for electrostatically deflecting the mirror plate.

In operation, the illumination light passes through the light transmissive substrate and illuminates the reflective surfaces of the mirror plates, from which the illumination light is modulated. The illumination light incident onto the areas corresponding to the surfaces of the posts are blocked (e.g. reflected or absorbed depending upon the materials of the light blocking pads) by the light blocking pads. The reflected illumination light from the mirror plates at the ON state is collected by a projection lens so as to generate a "bright" pixel in the display target. The reflected illumination from the mirror plates at the OFF state travels away from the projection lens, resulting in the corresponding pixels imagined at the display target to be "dark."

The micromirrors in the array can be arranged in many suitable ways. For example, the micromirrors can be arranged such that the center-to-center distance between the adjacent mirror plates can be 10.16 microns or less, such as 4.38 to 10.16 microns. The nearest distance between the edges of the mirror plate can be from 0.1 to 1.5 microns, such as from 0.15 to 0.45 micron, as set forth in U.S. patent applications Ser. No. 10/627,302, Ser. No. 10/627,155, and Ser. No. 10/627,303, both to Patel, filed Jul. 24, 2003, the subject matter of each being incorporated herein by reference.

Figure 18:
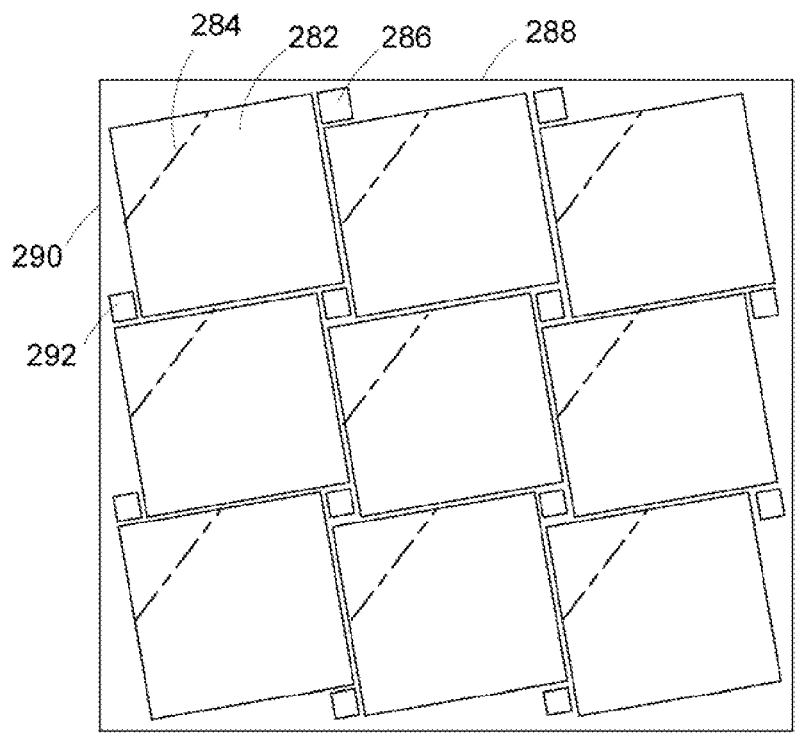
FIG. 18 is a top view of another exemplary micromirror array device.

The micromirrors in the micromirror array of the spatial light modulator can be arranged in alternative ways, another one of which is illustrated in FIG. 18. Referring to FIG. 18, each micromirror is rotated around its geometric center an angle less than 45° degrees. The posts (e.g. 286 and 292) of each micromirror (e.g. mirror 282) are then aligned to the opposite edges of the mirror plate. No edges of the mirror plate are parallel to an edge (e.g. edges 288 or 290) of the micromirror array. The rotation axis (e.g. axis 284) of each mirror plate is parallel to but offset from a diagonal of the mirror plate when viewed from the top of the mirror plate at a non-deflected state.

Figure 19:
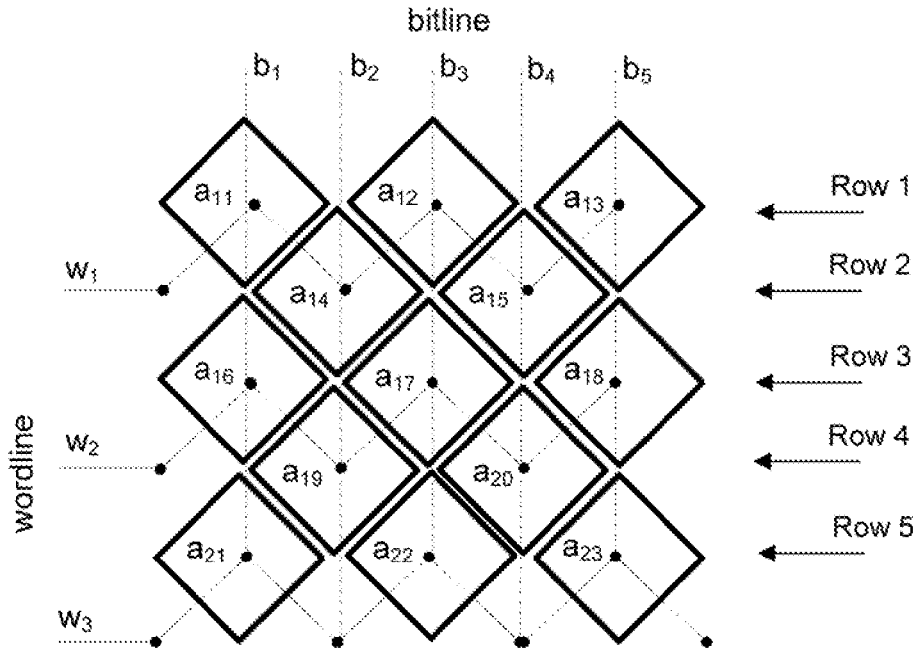
FIG. 19 is a top view of yet another exemplary micromirror array device.

FIG. 19 illustrates the top view of another micromirror array having an array of micromirrors of FIG. 16. In this example, each micromirror is rotated 45° degrees around its geometric center. For addressing the micromirrors, the bitlines and wordlines are deployed in a way such that each column of the array is connected to a bitline but each wordline alternatively connects micromirrors of adjacent rows. For example, bitlines $b_1$, $b_2$, $b_3$, $b_4$, and $b_5$ respectively connect micromirrors groups of ($a_{11}$, $a_{16}$, and $a_{21}$), ($a_{14}$ and $a_{19}$), ($a_{12}$, $a_{17}$, and $a_{22}$), ($a_{15}$ and $a_{20}$), and ($a_{13}$, $a_{18}$, and $a_{23}$). Wordlines $W_1$, $W_2$, and $W_3$ respectively connect micromirror groups ($a_{11}$, $a_{14}$, $a_{12}$, $a_{15}$, and $a_{13}$), ($a_{16}$, $a_{19}$, $a_{17}$, $a_{20}$, and $a_{18}$), and ($a_{21}$, $a_{22}$, and $a_{23}$). With this configuration, the total number of wordlines is less the total number of bitlines.

Figure 20:
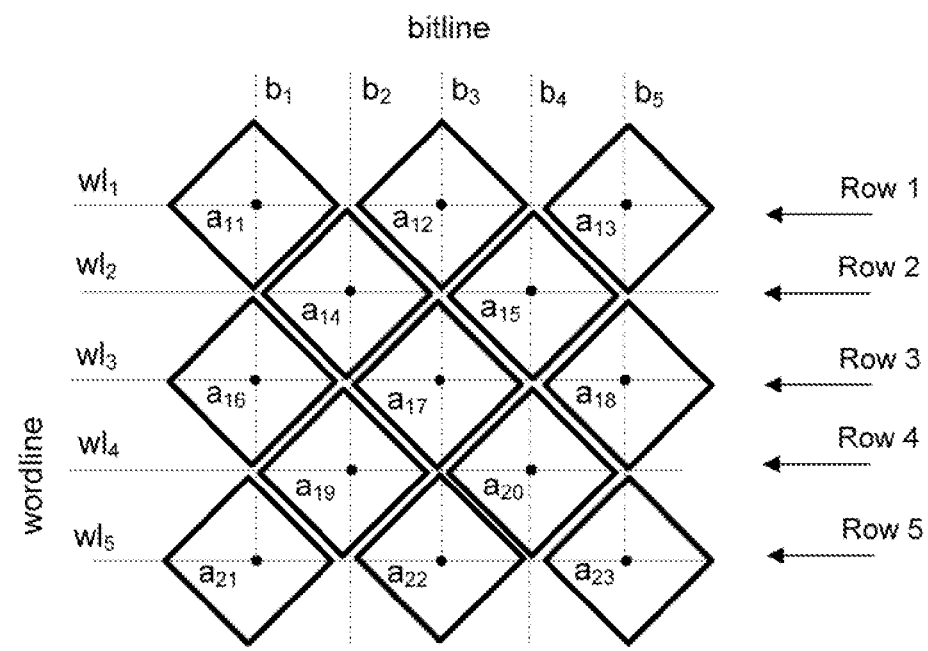
FIG. 20 is a top view of yet another exemplary micromirror array device.

For the same micromirror array, the bitlines and wordlines can be deployed in other ways, such as that shown in FIG. 20. Referring to FIG. 20, each row of micromirrors is provided with one wordline and one bitline. Specifically, bitlines $b_1$, $b_2$, $b_3$, $b_4$ and $b_5$ respectively connect column 1 (comprising micromirrors $a_{11}$, $a_{16}$, and $a_{21}$), column 2 (comprising micromirrors $a_{14}$ and $a_{19}$), column 3 (comprising micromirrors $a_{12}$, $a_{17}$, and $a_{22}$), column 4 (comprising micromirrors $a_{15}$ and $a_{20}$), and column 5 (comprising micromirrors $a_{13}$, $a_{18}$, and $a_{23}$). Wordlines $WL_1$, $WL_2$, $WL_3$, $WL_4$, and $WL_5$ respectively connect row 1 (comprising micromirrors $a_{11}$, $a_{12}$, and $a_{13}$), row 2 (comprising micromirrors $a_{14}$ and $a_{15}$), row 3 (comprising micromirrors $a_{16}$, $a_{17}$, and $a_{18}$), row 4 (comprising micromirrors $a_{19}$ and $a_{20}$) and row 5 (comprising micromirrors $a_{21}$, $a_{22}$, and $a_{23}$).

Figure 21A:
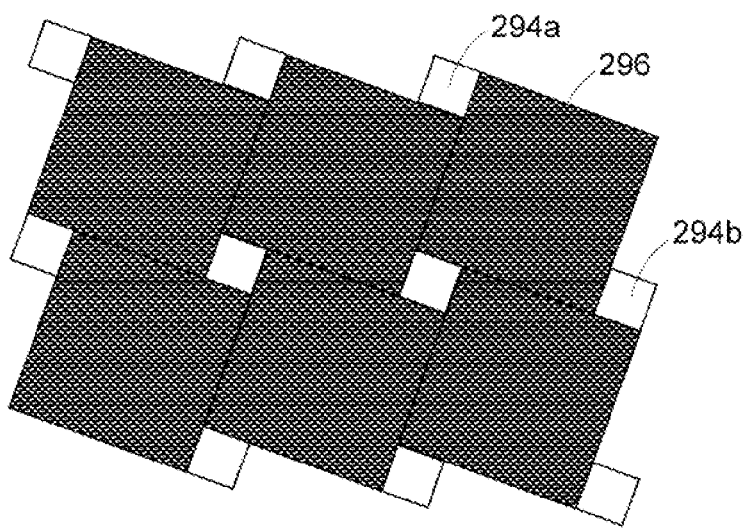
FIG. 21a is a top view of an array of exemplary addressing electrodes.
Figure 21B:
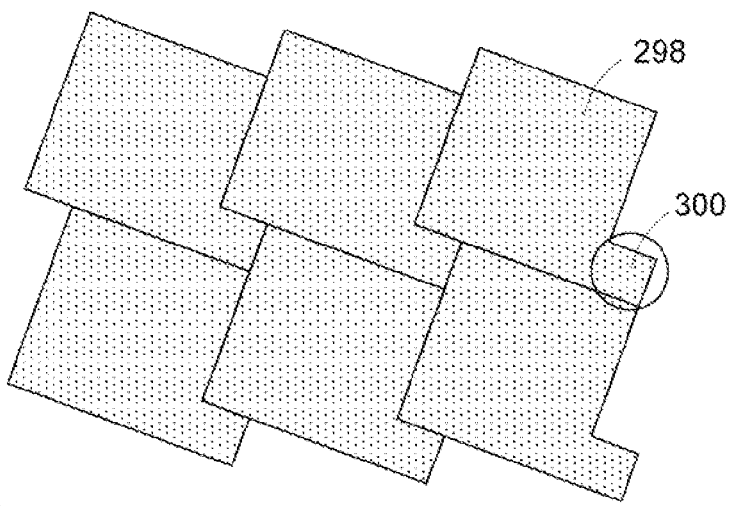
FIG. 21b is a top view of an array of exemplary mirror plates.
Figure 21C:
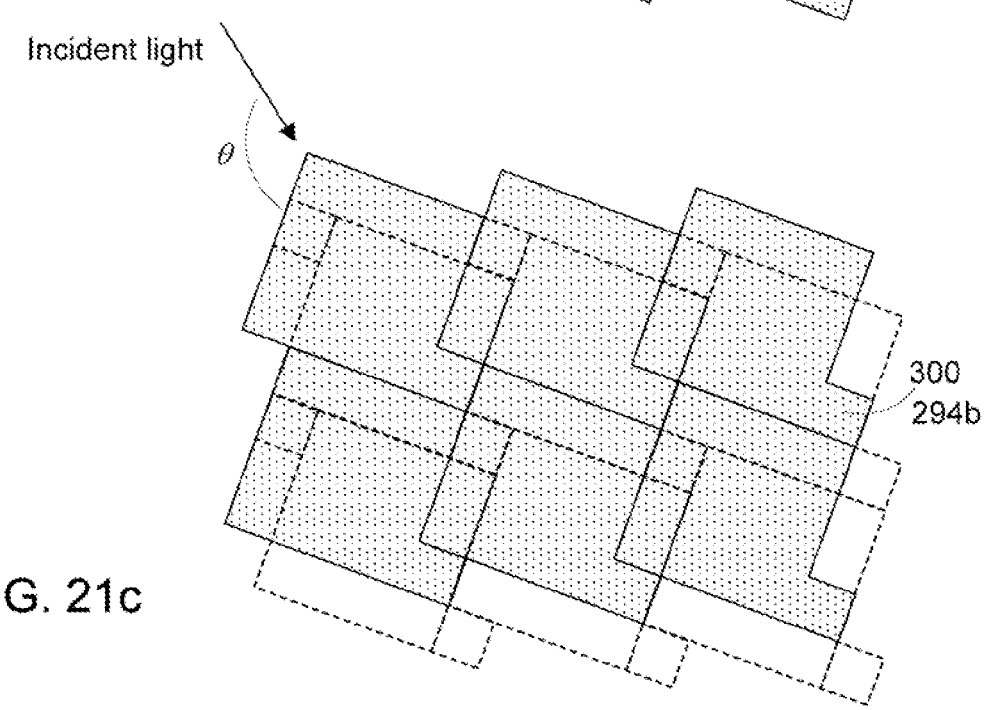
FIG. 21c is a top view of the addressing electrodes and mirror plates in FIGS. 21a and 21b after assembly.

The mirror plates of the micromirrors in the array can form a plurality of pockets, in which posts can be formed, wherein the pockets are covered by the extended areas of the addressing electrodes when viewed from the top of the micromirror array device, as shown in FIGS. 21a to 21c.

Referring to FIG. 21a, a portion of an array of mirror plates of the micromirrors is illustrated therein. The mirror plates in the array form a plurality of pockets in between. For example, pockets 294a and 294b are formed in which posts for supporting and holding mirror plate 296 can be formed. For individually addressing and deflecting the mirror plates in FIG. 21a, an array of addressing electrodes is provided, a portion of which is illustrated in FIG. 21b.

Referring to FIG. 21b, each addressing electrode has an extended portion, such as extended portion 300 of addressing electrode 298. Without the extended portion, the addressing electrode can be generally square, but having an area equal to or smaller than the mirror plate.

FIG. 21c illustrates a top view of a micromirror array device after the addressing electrodes in FIG. 21b and the mirror plates in FIG. 21a assembled together. It can be seen in the figure that each addressing electrode is displaced a particular distance along a diagonal of the mirror plate associated with the addressing electrode. As a result, the pockets presented between mirror plates are covered by the addressing electrode, specifically by the extended portions of the addressing electrodes. In this way, light scattering otherwise occurred in the substrate having the addressing electrodes can be removed. The quality, such as the contrast ratio of the displayed images can be improved.

When used in a spatial light modulator of a display system, the incident light beam is directed onto the mirror plates in a direction along the displacement direction of the addressing electrodes when viewed from the top of the addressing electrodes as shown in the figure. For example, the incident light has an angle θ to an edge of the addressing electrode (or the mirror plate) when viewed from the top; and the angle can be 135° degrees.

Figure 22:
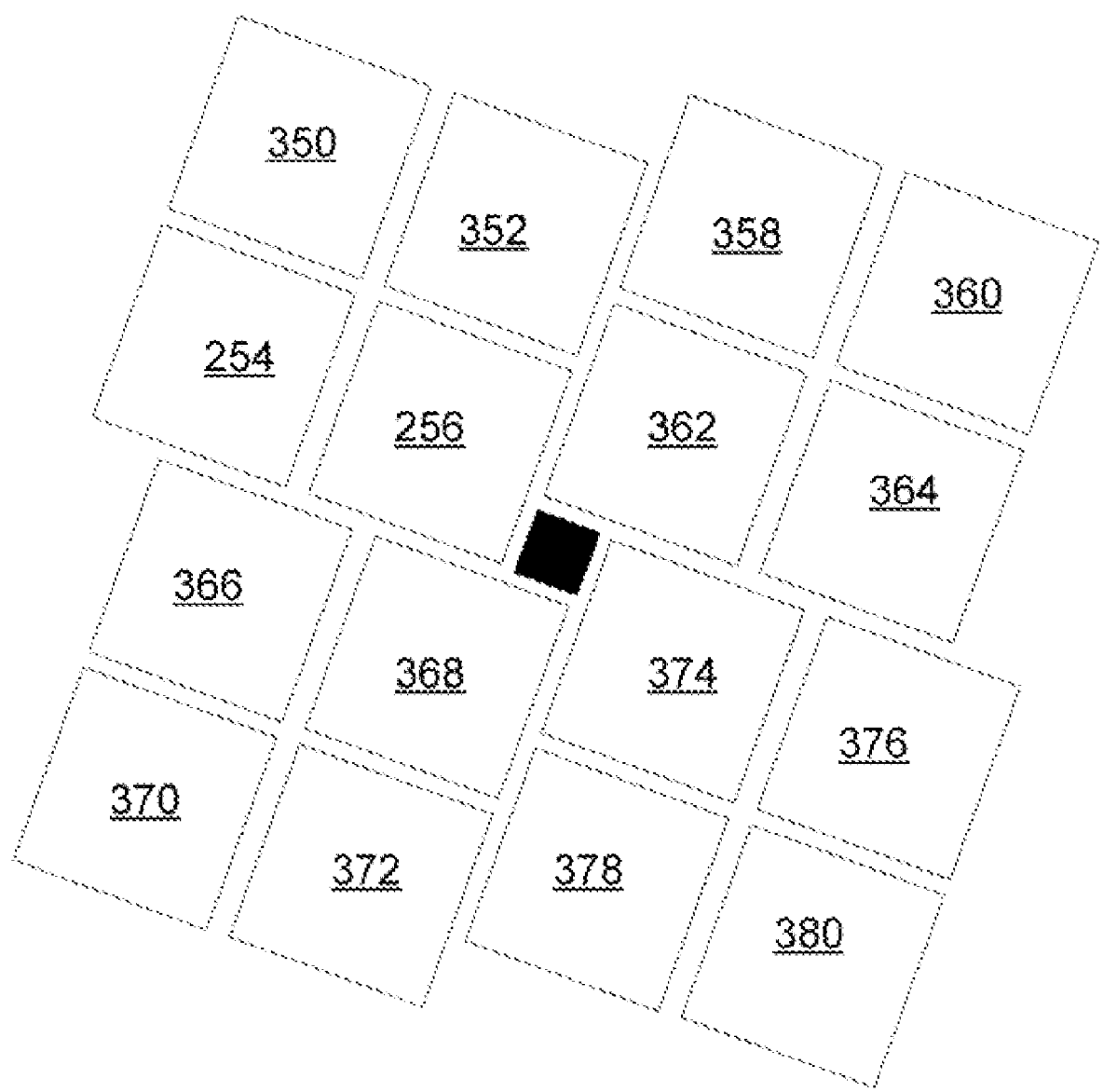
FIG. 22 is a top view of yet another exemplary micromirror device.

In an example not all the micromirror devices of a spatial light modulator have posts (e.g. at that set forth in U.S. patent application Ser. No. 10/969,251 and Ser. No. 10/969,503 both filed Oct. 19, 2004, the subject matter of each being incorporated herein by reference in entirety. An example of such micromirror array device is illustrated in a top view in FIG. 22. For simplicity purposes, only sixteen micromirror devices of the micromirror array device are illustrated. In this specific example, every four adjacent micromirrors are formed into a micromirror group, such as the group comprising micromirrors 350, 352, 254, and 356, the group comprising 358, 360, 362, and 364, the group comprising micromirrors 366, 368, 370, and 372, and the group comprising micromirrors 374, 376, 378 and 380. Adjacent groups (e.g. the above four micromirror groups) share a post that is represented by the black square for supporting the mirror plates of the micromirrors in the four micromirror groups. The exposed surface of the post can be covered by a light blocking film. In general, the posts of a micromirror array device, wherein not all micromirrors are provided with a post, can all be coated with light blocking pads. Alternatively, only a number of (but not all) the posts are coated with light blocking pads.

Figure 23:
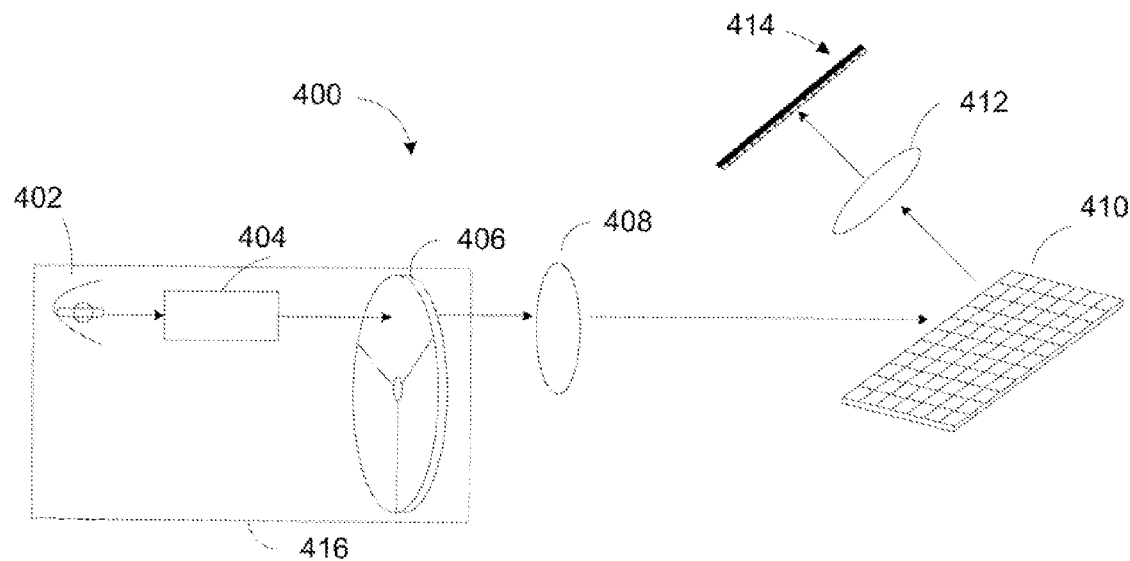
FIG. 23 is demonstratively illustrates an exemplary display system having a spatial light modulator.

FIG. 23 schematically illustrates an exemplary display system that employs a spatial light modulator in which methods and apparatus disclosed above can be implemented. In this particular example, display system 400 comprises light source illumination system 416, group lens 408, spatial light modulator 410, projection lens 412, and display target 414. The illumination system may further comprise light source 402, light pipe 404, and color filter 406 such as a color wheel. Alternative to the illumination system 416 as shown in the figure wherein the color wheel is positioned after the light pipe along the propagation path of the illumination light from the light source, the color wheel can also be positioned between the light source and light pipe at the propagation path of the illumination light. The illumination light can be polarized or non-polarized. When polarized illumination light is used, display target 414 may comprise a polarization filter associated with the polarized illumination light, as set forth in U.S. provisional patent application Ser. No. 60/577,422 filed Jun. 4, 2004, the subject matter being incorporated herein by reference.

The light source can be any suitable light source, such as an arc lamp, preferably an arc lamp with a short arc for obtaining intensive illumination light. The light source can also be an arc lamp with a spiral reflector, as set forth in U.S. patent application Ser. No. 11/055,654 filed Feb. 9, 2005, the subject matter being incorporated herein by reference.

The lightpipe (404) can be a standard lightpipe that are widely used in digital display systems for delivering homogenized light from the light source to spatial light modulators. Alternatively, the lightpipe can be the one with movable reflective surfaces, as set forth in U.S. patent provisional application Ser. No. 60/620,395 filed Oct. 19, 2004, the subject matter being incorporated herein by reference.

The color wheel (406) comprises a set of color and/or white segments, such as red, green, blue, or yellow, cyan, and magenta. The color wheel may further comprise a clear or non-clear segment, such as a high throughput or white segment for achieving particular purposes, as set forth in U.S. patent application Ser. No. 10/899,637, and Ser. No. 10/899,635 both filed Jul. 26, 2004, the subject matter of each being incorporated herein by reference, which will not be discussed in detail herein.

Figure 24:
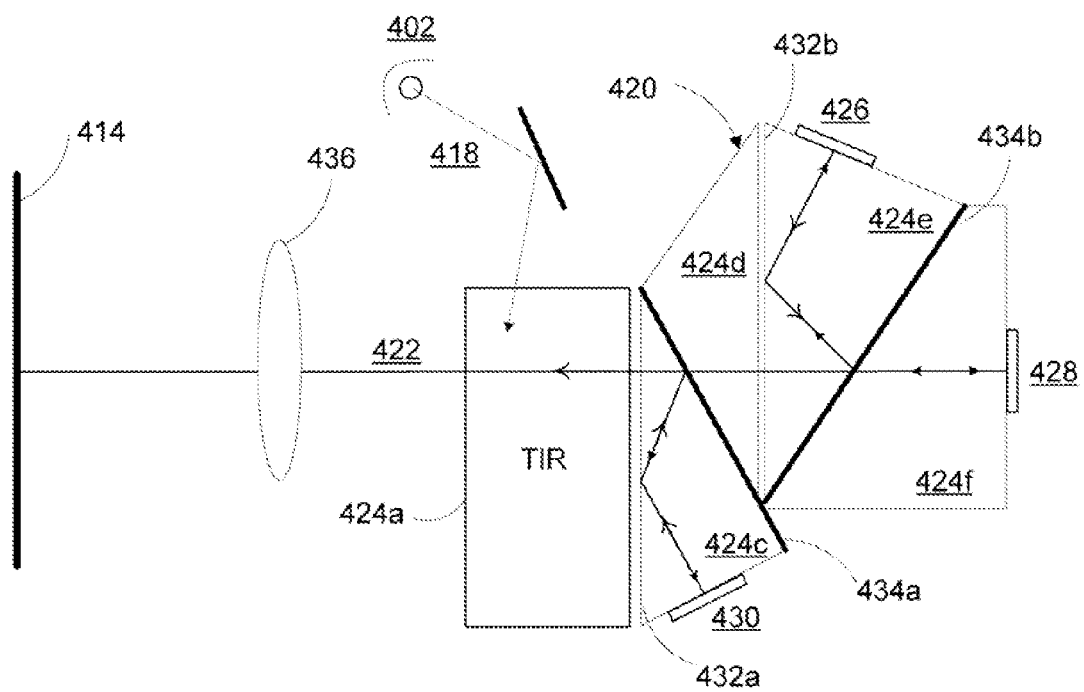
FIG. 24 is demonstratively illustrates another exemplary display system having multiple spatial light modulators.

The display system in FIG. 24 employs one spatial light modulator. However, a display system may use multiple spatial light modulators for modulating the illumination light of different colors. One of such display systems is schematically illustrated in FIG. 24. Referring to FIG. 24, the display system uses a dichroic prism assembly 420 for splitting incident light into three primary color light beams. Dichroic prism assembly comprises TIR 424a, 424c, 424d, 424e and 424f. Totally-internally-reflection (TIR) surfaces, i.e. TIR surfaces 434a and 434b, are defined at the prism surfaces that face air gaps. The surfaces 432a and 432b of prisms 424c and 424e are coated with dichroic films, yielding dichroic surfaces. In particular, dichroic surface 432a reflects green light and transmits other light. Dichroic surface 432b reflects red light and transmits other light. The three spatial light modulators, 430, 426 and 428, each having a micromirror array device, are arranged around the prism assembly.

In operation, incident white light 418 from light source 402 enters into TIR 424a and is directed towards spatial light modulator 428, which is designated for modulating the blue light component of the incident white light. At the dichroic surface 432a, the green light component of the totally internally reflected light from TIR surface 434a is separated therefrom and reflected towards spatial light modulator 430, which is designated for modulating green light. As seen, the separated green light may experience TIR by TIR surface 434b in order to illuminate spatial light modulator 430 at a desired angle. This can be accomplished by arranging the incident angle of the separated green light onto TIR surface 434b larger than the critical TIR angle of TIR surface 434b. The rest of the light components, other than the green light, of the reflected light from the TIR surface 434a pass through dichroic surface 432a and are reflected at dichroic surface 432b. Because dichroic surface 432b is designated for reflecting red light component, the red light component of the incident light onto dichroic surface 432b is thus separated and reflected onto spatial light modulator 426, which is designated for modulating red light. Finally, the blue component of the white incident light (white light 418) reaches spatial light modulator 428 and is modulated thereby. By collaborating operations of the three spatial light modulators, red, green, and blue lights can be properly modulated. The modulated red, green, and blue lights are recollected and delivered onto display target 414 through optic elements, such as projection lens 436, if necessary.

The projection systems may alternatively employ Light-Emitting-Diodes as light sources for providing illumination light beams due to many advantages, such as compact size, longer lifetime than arc lamps, lower heating than arc lamps, and narrower bandwidth than arc lamps. As an example, gallium nitride light emitting diodes can be used for the green and blue arrays, and gallium arsenide (aluminum gallium arsenide) could be used for the red light emitting diode array. LEDs such as available or disclosed by Nichia TM or Lumileds TM could be used, or any other suitable light emitting diodes. Some of the current LEDs have a lifetime of 100,000 hours or more, which is almost 10 times higher than the lifetime of the current UHP arc lamp with the longest lifetime. LEDs are cold light source, which yields much less heat than arc lamps. Even using multiple LEDs in a display system, the total heat generated by the LEDs can be dissipated much easier than using the arc lamps, because the heat generated by the LEDs is omni-directional as compared to the heat generated by the arc lamps wherein the heat has preferred orientations. Currently, LEDs of different colors have been developed. When multiple LEDs of different colors, such as red, green, and blue, are concurrently employed in the display system, beam splitting elements, such as color wheel, that are required for the arc lamp, can be omitted. Without light splitting elements, system design and manufacturing can be significantly simplified. Moreover, the display system can be made more compact and portable.

As compared to current arc lamps, LEDs are also superior in spectrum to arc lamps. The spectrum of a LED has a typical width of 10 nm to 35 nm. However, the typical spectrum width of the colors (e.g. red, green, and blue) derived from the color wheel used in combination with an arc lamp is approximately 70 nm, which is much larger than that of the LED. In other words, LEDs have much purer colors than arc lamps, resulting in more abundant colors than arc lamps.

Like arc lamps, LEDs may have the color balance problem, wherein different colors may have different intensities. This problem for LEDs, however, can be solved simply by time-mixing or spatial-mixing mode. In spatial-mixing mode, different number of LEDs for different colors can be provided for balancing the intensity discrepancies in different colors. In time-mixing mode, the color can be balanced by tuning the ON-time ratio of different LEDs for different colors. To be commensurate with the display system, the LEDs used in the projection system preferably have a light flux of 3 lumens or higher, such as 4.4 lumens or higher, and 11.5 lumens or higher.

Using multiple LEDs of different colors has other practical benefits as compared to using the arc lamp and color wheel. In the display system using the arc lamp and color wheel, color transition unavoidably occurs as the color wheel spins and color fields in the color wheel sequentially sweeps across the micromirror array of the spatial light modulator. The color transition cast extra design for the system, which complicate the system. Moreover, color transition reduces optical efficiency of the system, for example, a portion of the incident light has to be sacrificed. As a comparison, LEDs may not have the color transition problem. Regardless whether the LEDs sequentially or concurrently illuminating the micromirror devices of the spatial light modulator, all micromirror devices of the spatial light modulator can be illuminated by a light beam of specific color at a time.

Figure 25:
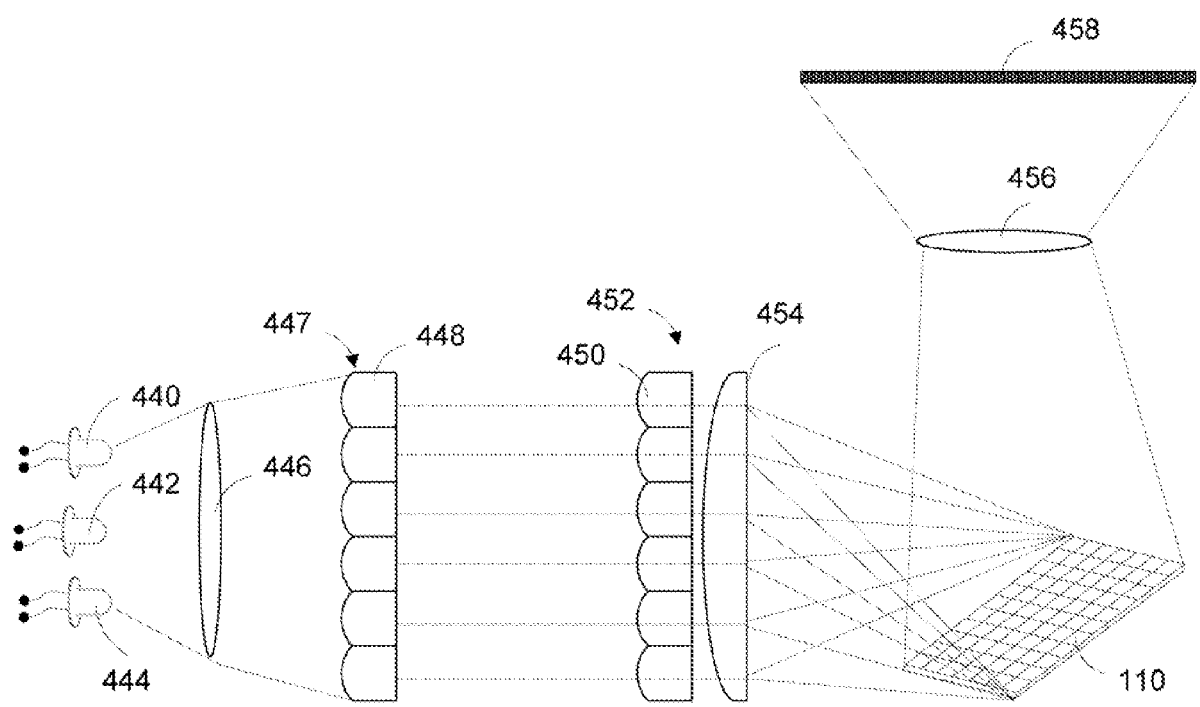
FIG. 25 demonstratively illustrates another exemplary projection system using an illumination system comprising a LED for the light source.

Referring to FIG. 25, an exemplary display system using LEDs as light source is demonstratively illustrated therein. In this example, the projection system comprises a LED array (e.g. LEDs 440, 442, and 444) for providing illumination light beam for the system. For demonstration purposes only, three LEDs are illustrated in the figure. In practice, the LED group may have any suitable number of LEDs, including a single LED. The LEDs can be of the same color (e.g. white color) or different colors (e.g. red, green, and blue). The light beams from the LED array are projected onto front fly-eye lens 447 through collimation lens 446. Fly-eye lens 447 comprises multiple unit lenses such as unit lens 448. The unit lenses on fly-eye lens 447 can be cubical lens or any other suitable lenses, and the total number of the unit lenses in the fly-eye lens 447 can be any desired numbers. At fly-eye lens 447, the light beam from each of the LEDs 440, 442, and 444 is split into a number of sub-light beams with the total number being equal to the total number of unit lenses of fly-eye lens 447. After collimate lens 446 and fly-eye lens 447, each LEDs 440, 442, and 444 is imaged onto each unit lens (e.g. unit lens 450) of rear fly-eye lens 452. Rear fly-eye lens 452 comprises a plurality of unit lenses each of which corresponds to one of the unit lenses of the front fly-eye lens 447, such that each of the LEDs forms an image at each unit lens of the rear fly-eye lens 452. Projection lens 454 projects the light beams from each unit lens of fly-eye lens 450 onto spatial light modulator 110. With the above optical configuration, the light beams from the LEDs of the light source can be uniformly projected onto the micromirror devices of the spatial light modulator.

In the display system, a single LED can be used, in which instance, the LED preferably provides white color. Alternatively, an array of LEDs capable of emitting the same (e.g. white) or different colors (e.g. red, green, and blue) can be employed. Especially when multiple LEDs are employed for producing different colors, each color can be produced by one or more LEDs. In practical operation, it may be desired that different colors have approximately the same or specific characteristic spectrum widths. It may also be desired that different colors have the same illumination intensity. These requirements can be satisfied by juxtaposing certain number of LEDs with slightly different spectrums.

It will be appreciated by those skilled in the art that a new and useful packaging method and apparatus have been described herein. In view of the many possible embodiments, however, it should be recognized that the embodiments described herein with respect to the drawing figures are meant to be illustrative only and should not be taken as limiting the scope of what is claimed. Those of skill in the art will recognize that the illustrated embodiments can be modified in arrangement and detail. Therefore, the devices and methods as described herein contemplate all such embodiments as may come within the scope of the following claims and equivalents thereof.

I claim:

1. A method, comprising:
   placing a micromirror array device on a supporting surface of a package, said package substrate comprising a plurality of substrate layers with an embedded heater laminated between two of the substrate layers under the top surface of the package substrate;
   placing a package lid on a top surface of the package substrate with a solder medium disposed therebetween;
   producing a first temperature gradient from the package lid to the solder medium and a second temperature gradient from the embedded heater to the solder medium so as to melt the solder medium; and
   wherein at least one of the first and second temperature gradients is produced such that a temperature at the solder medium is equal to or higher than a melting temperature of the solder medium.

2. The method of claim 1, wherein the package lid is heated by an external heater that is placed against a surface of the package lid such that the package lid is heated uniformly.

3. The method of claim 2, wherein external heater has a temperature from 180° C. to 300° C.

4. The method of claim 2, wherein the embedded heater has a temperature from 180° C. to 260° C.

5. The method of claim 2, wherein the package substrate is placed on a heat exchanger that has a temperature of 80° C. or lower.

* * * * *

UNITED STATES PATENT AND TRADEMARK OFFICE
CERTIFICATE OF CORRECTION

PATENT NO. : 7,655,553 B2  Page 1 of 1
APPLICATION NO. : 11/622179
DATED : February 2, 2010
INVENTOR(S) : Gregory P. Schaadt It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 479 days.

Signed and Sealed this

Twenty-eighth Day of December, 2010

David J. Kappos
*Director of the United States Patent and Trademark Office*